US009166852B2

(12) United States Patent
Davierwalla et al.

(10) Patent No.: US 9,166,852 B2
(45) Date of Patent: Oct. 20, 2015

(54) LOW NOISE AMPLIFIERS WITH TRANSFORMER-BASED SIGNAL SPLITTING FOR CARRIER AGGREGATION

(75) Inventors: Anosh Bomi Davierwalla, San Diego, CA (US); Aleksandar Miodrag Tasic, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 31 days.

(21) Appl. No.: 13/599,919

(22) Filed: Aug. 30, 2012

(65) Prior Publication Data
US 2013/0316668 A1 Nov. 28, 2013

Related U.S. Application Data

(60) Provisional application No. 61/652,064, filed on May 25, 2012.

(51) Int. Cl.
*H04B 1/16* (2006.01)
*H04B 1/18* (2006.01)
(Continued)

(52) U.S. Cl.
CPC ............ *H04L 27/2647* (2013.01); *H03F 1/223* (2013.01); *H03F 3/193* (2013.01); *H03F 3/68* (2013.01); *H03F 3/72* (2013.01); *H03G 3/20* (2013.01)

(58) Field of Classification Search
CPC ...... H03G 3/20; H04L 27/2647; H03F 1/223; H03F 3/68; H03F 3/72; H03F 3/193; H03F 1/26; H03F 3/45188; H03F 2200/294; H03F 2200/372; H03F 2200/541; H03F 2200/06; H03F 2203/45386; H03F 2203/45396; H03F 2200/09; H04B 1/18
USPC ......... 455/205–209, 334, 130, 143–144, 147, 455/168.1, 188.1, 189.1, 196.1, 255, 258, 455/292, 293, 315, 323, 340–341; 330/295; 375/316
See application file for complete search history.

(56) References Cited

U.S. PATENT DOCUMENTS 3,911,364 A   10/1975   Langseth et al.
4,035,728 A    7/1977   Ishikawa et al.
(Continued)

FOREIGN PATENT DOCUMENTS

CN   1523912 A   8/2004
CN   1922795 A   2/2007
(Continued)

OTHER PUBLICATIONS

International Search Report and Written Opinion—PCT/US2013/042748—ISA/EPO—Oct. 14, 2013.
(Continued)

*Primary Examiner* — Pablo Tran
(74) *Attorney, Agent, or Firm* — Ramin Mobarhan

(57) ABSTRACT

Low noise amplifiers (LNAs) supporting carrier aggregation are disclosed. In an exemplary design, an apparatus (e.g., a wireless device, an integrated circuit, etc.) includes an amplifier circuit, a transformer, and a plurality of downconverters. The amplifier circuit receives and amplifies an input radio frequency (RF) signal and provides an amplified RF signal. The input RF signal includes transmissions sent on multiple carriers at different frequencies to a wireless device. The transformer includes a primary coil coupled to the amplifier circuit and a plurality of secondary coils providing a plurality of output RF signals. The plurality of downconverters downconvert the plurality of output RF signals with a plurality of local oscillator (LO) signals at different frequencies. Each downconverter includes a pair of mixers that receives one output RF signal and one LO signal and provides inphase and quadrature downconverted signals for one set of carriers being received.

19 Claims, 12 Drawing Sheets

(51) Int. Cl.
*H04L 27/26* (2006.01)
*H03G 3/20* (2006.01)
*H03F 1/22* (2006.01)
*H03F 3/193* (2006.01)
*H03F 3/68* (2006.01)
*H03F 3/72* (2006.01)

(56) References Cited

U.S. PATENT DOCUMENTS

| | | | |
|---|---|---|---|
| 4,035,729 A | 7/1977 | Perry | |
| 4,246,655 A | 1/1981 | Parker | |
| 4,326,294 A | 4/1982 | Okamoto et al. | |
| 4,715,048 A | 12/1987 | Masamura | |
| 4,742,563 A | 5/1988 | Fukumura | |
| 4,756,023 A | 7/1988 | Kojima | |
| 4,969,207 A | 11/1990 | Sakamoto et al. | |
| 5,056,411 A | 10/1991 | Baker | |
| 5,128,630 A | 7/1992 | Mijuskovic | |
| 5,291,519 A | 3/1994 | Tsurumaru | |
| 5,321,850 A | 6/1994 | Backstrom et al. | |
| 5,345,601 A | 9/1994 | Takagi et al. | |
| 5,390,342 A | 2/1995 | Takayama et al. | |
| 5,559,838 A | 9/1996 | Nakagoshi | |
| 5,566,364 A | 10/1996 | Mizoguchi et al. | |
| 5,694,396 A | 12/1997 | Firouzbakht et al. | |
| 5,697,083 A | 12/1997 | Sano | |
| 5,761,613 A | 6/1998 | Saunders et al. | |
| 5,794,159 A | 8/1998 | Portin | |
| 5,805,643 A | 9/1998 | Seki et al. | |
| 5,805,989 A | 9/1998 | Ushida | |
| 5,835,853 A | 11/1998 | Enoki et al. | |
| 5,940,452 A | 8/1999 | Rich | |
| 5,999,815 A | 12/1999 | Tenbrook et al. | |
| 5,999,990 A | 12/1999 | Sharrit et al. | |
| 6,026,288 A | 2/2000 | Bronner | |
| 6,040,732 A | 3/2000 | Brokaw | |
| 6,044,254 A | 3/2000 | Ohta et al. | |
| 6,063,961 A | 5/2000 | Kroner | |
| 6,069,923 A | 5/2000 | Ostman et al. | |
| 6,088,348 A | 7/2000 | Bell, III | |
| 6,208,844 B1 | 3/2001 | Abdelgany | |
| 6,249,687 B1 | 6/2001 | Thomsen et al. | |
| 6,407,689 B1 | 6/2002 | Bazarjani et al. | |
| 6,424,683 B1 | 7/2002 | Schoellhorn | |
| 6,430,237 B1 | 8/2002 | Anvari | |
| 6,472,947 B1 | 10/2002 | Zeitz | |
| 6,473,601 B1 | 10/2002 | Oda | |
| 6,522,895 B1 | 2/2003 | Montalvo | |
| 6,535,725 B2 | 3/2003 | Hatcher et al. | |
| 6,600,759 B1 | 7/2003 | Wood | |
| 6,600,907 B1 | 7/2003 | Taguchi | |
| 6,600,931 B2 | 7/2003 | Sutton et al. | |
| 6,657,498 B2 | 12/2003 | Park et al. | |
| 6,806,777 B2 | 10/2004 | Franca-Neto | |
| 6,819,941 B2 | 11/2004 | Dening et al. | |
| 6,888,888 B1 | 5/2005 | Tu et al. | |
| 6,952,594 B2 | 10/2005 | Hendin | |
| 6,954,446 B2 | 10/2005 | Kuffner | |
| 6,983,132 B2 | 1/2006 | Woo et al. | |
| 6,985,712 B2 | 1/2006 | Yamakawa et al. | |
| 6,987,950 B2 | 1/2006 | Coan | |
| 7,013,166 B2 | 3/2006 | Clifford | |
| 7,023,272 B2 | 4/2006 | Hung et al. | |
| 7,024,172 B1 | 4/2006 | Murphy et al. | |
| 7,039,377 B2 | 5/2006 | Yates | |
| 7,123,891 B2* | 10/2006 | Loke | 455/130 |
| 7,142,042 B1 | 11/2006 | Henry | |
| 7,161,423 B2 | 1/2007 | Paul et al. | |
| 7,167,044 B2 | 1/2007 | Li et al. | |
| 7,187,239 B2 | 3/2007 | Yeh | |
| 7,187,735 B2 | 3/2007 | Kent, III | |
| 7,187,904 B2 | 3/2007 | Gainey et al. | |
| 7,212,788 B2 | 5/2007 | Weber et al. | |
| 7,224,231 B2* | 5/2007 | Wu | 330/301 |
| 7,260,377 B2 | 8/2007 | Burns et al. | |
| 7,283,851 B2 | 10/2007 | Persico et al. | |
| 7,299,021 B2 | 11/2007 | Parssinen et al. | |
| 7,313,368 B2 | 12/2007 | Wu et al. | |
| 7,317,894 B2 | 1/2008 | Hirose | |
| 7,333,831 B2 | 2/2008 | Srinivasan et al. | |
| 7,356,325 B2 | 4/2008 | Behzad et al. | |
| 7,372,336 B2 | 5/2008 | Lee et al. | |
| 7,403,508 B1 | 7/2008 | Miao | |
| 7,444,166 B2 | 10/2008 | Sahota et al. | |
| 7,454,181 B2 | 11/2008 | Banister et al. | |
| 7,477,106 B2 | 1/2009 | Van Bezooijen et al. | |
| 7,486,135 B2* | 2/2009 | Mu | 330/51 |
| 7,570,111 B1 | 8/2009 | Vagher et al. | |
| 7,599,675 B2* | 10/2009 | Mu et al. | 455/240.1 |
| 7,643,847 B2 | 1/2010 | Daanen et al. | |
| 7,643,848 B2 | 1/2010 | Robinett et al. | |
| 7,697,905 B2 | 4/2010 | Lee et al. | |
| 7,728,664 B2 | 6/2010 | Chang et al. | |
| 7,751,513 B2 | 7/2010 | Eisenhut et al. | |
| 7,764,726 B2 | 7/2010 | Simic et al. | |
| 7,848,724 B2 | 12/2010 | Bult et al. | |
| 7,869,528 B2 | 1/2011 | Robinson | |
| 7,877,075 B1 | 1/2011 | Jin et al. | |
| 7,911,269 B2 | 3/2011 | Yang et al. | |
| 7,944,298 B2 | 5/2011 | Cabanillas et al. | |
| 7,949,309 B2 | 5/2011 | Rofougaran et al. | |
| 7,952,398 B2 | 5/2011 | Salcido et al. | |
| 8,022,772 B2 | 9/2011 | Cassia et al. | |
| 8,055,229 B2 | 11/2011 | Huang | |
| 8,063,706 B2 | 11/2011 | Li et al. | |
| 8,081,672 B2 | 12/2011 | Kent et al. | |
| 8,090,332 B2 | 1/2012 | Sahota et al. | |
| 8,090,369 B2 | 1/2012 | Kitazoe | |
| 8,139,670 B1 | 3/2012 | Son et al. | |
| 8,149,955 B2 | 4/2012 | Tired | |
| 8,195,117 B2 | 6/2012 | Bult et al. | |
| 8,208,887 B2* | 6/2012 | Lee et al. | 455/292 |
| 8,217,723 B2 | 7/2012 | Rajendran et al. | |
| 8,242,841 B2* | 8/2012 | Zhang | 330/254 |
| 8,270,499 B2* | 9/2012 | Chang et al. | 375/258 |
| 8,270,927 B2 | 9/2012 | Wallace et al. | |
| 8,290,449 B2* | 10/2012 | Keehr et al. | 455/114.1 |
| 8,295,778 B2 | 10/2012 | Kotecha et al. | |
| 8,306,494 B2* | 11/2012 | Ojo | 455/248.1 |
| 8,442,473 B1 | 5/2013 | Kaukovuori et al. | |
| 8,514,015 B2 | 8/2013 | Chen | |
| 8,571,510 B2 | 10/2013 | Liu et al. | |
| 8,600,315 B2 | 12/2013 | Roufoogaran et al. | |
| 8,626,084 B2* | 1/2014 | Chan et al. | 455/78 |
| 8,676,148 B2 | 3/2014 | Ogasawara | |
| 8,706,069 B2 | 4/2014 | Khoini-Poorfard et al. | |
| 2002/0008575 A1 | 1/2002 | Oskowsky et al. | |
| 2002/0061773 A1 | 5/2002 | Adachi et al. | |
| 2002/0111163 A1 | 8/2002 | Hamabe | |
| 2002/0132597 A1 | 9/2002 | Peterzell et al. | |
| 2002/0173337 A1 | 11/2002 | Hajimiri et al. | |
| 2002/0193108 A1 | 12/2002 | Robinett | |
| 2003/0076797 A1 | 4/2003 | Lozano | |
| 2003/0081694 A1 | 5/2003 | Wieck | |
| 2003/0125040 A1 | 7/2003 | Walton et al. | |
| 2003/0148750 A1 | 8/2003 | Yan et al. | |
| 2003/0157915 A1 | 8/2003 | Atkinson et al. | |
| 2003/0176176 A1 | 9/2003 | Leinonen et al. | |
| 2003/0203743 A1 | 10/2003 | Sugar et al. | |
| 2003/0206076 A1 | 11/2003 | Hashemi et al. | |
| 2003/0228851 A1 | 12/2003 | Taniguchi | |
| 2004/0087290 A1 | 5/2004 | Schmidt et al. | |
| 2004/0092243 A1 | 5/2004 | Hey-Shipton | |
| 2004/0113746 A1 | 6/2004 | Brindle | |
| 2004/0116086 A1 | 6/2004 | Huttunen | |
| 2004/0121753 A1 | 6/2004 | Sugar et al. | |
| 2004/0204104 A1 | 10/2004 | Horng et al. | |
| 2004/0219959 A1 | 11/2004 | Khayrallah et al. | |
| 2004/0224643 A1 | 11/2004 | Nakai | |
| 2004/0253955 A1 | 12/2004 | Love et al. | |
| 2004/0266356 A1 | 12/2004 | Javor et al. | |
| 2005/0039060 A1 | 2/2005 | Okayasu | |
| 2005/0075077 A1 | 4/2005 | Mach et al. | |

(56) References Cited

U.S. PATENT DOCUMENTS

| | | |
|---|---|---|
| 2005/0079847 A1 | 4/2005 | Arafa |
| 2005/0118977 A1 | 6/2005 | Drogi et al. |
| 2005/0197090 A1 | 9/2005 | Stockstad et al. |
| 2005/0215264 A1 | 9/2005 | Subramaniam et al. |
| 2005/0231290 A1 | 10/2005 | Hung et al. |
| 2005/0265084 A1 | 12/2005 | Choi |
| 2005/0277387 A1 | 12/2005 | Kojima et al. |
| 2006/0009177 A1 | 1/2006 | Persico et al. |
| 2006/0023745 A1 | 2/2006 | Koo et al. |
| 2006/0061773 A1 | 3/2006 | Lee et al. |
| 2006/0121937 A1 | 6/2006 | Son |
| 2006/0128322 A1 | 6/2006 | Igarashi et al. |
| 2006/0146693 A1 | 7/2006 | Mori et al. |
| 2006/0170503 A1 | 8/2006 | Lee et al. |
| 2006/0189286 A1 | 8/2006 | Kyu et al. |
| 2006/0222100 A1 | 10/2006 | Behzad |
| 2006/0234662 A1 | 10/2006 | Diloisy |
| 2006/0291428 A1 | 12/2006 | Filipovic |
| 2007/0049332 A1 | 3/2007 | Higuchi |
| 2007/0060080 A1 | 3/2007 | Nishimura et al. |
| 2007/0072577 A1 | 3/2007 | Rozenblit et al. |
| 2007/0105517 A1 | 5/2007 | Chang et al. |
| 2007/0142013 A1 | 6/2007 | Bucknor et al. |
| 2007/0177656 A1 | 8/2007 | Maruta et al. |
| 2007/0177693 A1 | 8/2007 | Kluge |
| 2007/0184801 A1 | 8/2007 | Kogawa et al. |
| 2007/0197170 A1 | 8/2007 | Boos |
| 2007/0197178 A1 | 8/2007 | Gu |
| 2007/0197204 A1 | 8/2007 | Herczog et al. |
| 2007/0202890 A1 | 8/2007 | Feher |
| 2007/0242784 A1 | 10/2007 | Sampson et al. |
| 2007/0243832 A1 | 10/2007 | Park et al. |
| 2007/0262817 A1 | 11/2007 | Ciccarelli et al. |
| 2007/0262871 A1 | 11/2007 | Yamagajo et al. |
| 2008/0004078 A1 | 1/2008 | Barratt et al. |
| 2008/0013654 A1 | 1/2008 | Rick et al. |
| 2008/0117999 A1 | 5/2008 | Kadous et al. |
| 2008/0139151 A1 | 6/2008 | Ojo et al. |
| 2008/0204148 A1 | 8/2008 | Kim et al. |
| 2008/0224770 A1 | 9/2008 | Kim et al. |
| 2008/0224791 A1 | 9/2008 | Cheng |
| 2008/0225971 A1 | 9/2008 | Behzad |
| 2008/0261650 A1 | 10/2008 | Piriyapoksombut et al. |
| 2008/0297259 A1 | 12/2008 | Mu |
| 2009/0124227 A1 | 5/2009 | Ishiguro |
| 2009/0227214 A1 | 9/2009 | Georgantas et al. |
| 2009/0237161 A1 | 9/2009 | Fagg |
| 2009/0243869 A1 | 10/2009 | Sanderford, Jr. |
| 2009/0253456 A1 | 10/2009 | Toh et al. |
| 2009/0290659 A1 | 11/2009 | Petrovic et al. |
| 2009/0323779 A1 | 12/2009 | Lennen |
| 2010/0019970 A1 | 1/2010 | Farrokhi et al. |
| 2010/0034094 A1 | 2/2010 | Tenny |
| 2010/0040178 A1 | 2/2010 | Sutton et al. |
| 2010/0041359 A1 | 2/2010 | Liu et al. |
| 2010/0142440 A1 | 6/2010 | Inoue |
| 2010/0195754 A1 | 8/2010 | Li et al. |
| 2010/0197263 A1 | 8/2010 | Dwyer et al. |
| 2010/0210226 A1 | 8/2010 | Matsuyama |
| 2010/0210272 A1 | 8/2010 | Sundstrom et al. |
| 2010/0210299 A1 | 8/2010 | Gorbachov |
| 2010/0214184 A1 | 8/2010 | Tran et al. |
| 2010/0225414 A1 | 9/2010 | Gorbachov |
| 2010/0226327 A1 | 9/2010 | Zhang et al. |
| 2010/0232493 A1 | 9/2010 | Thirumoorthy |
| 2010/0237947 A1 | 9/2010 | Xiong et al. |
| 2010/0253435 A1 | 10/2010 | Ichitsubo et al. |
| 2010/0265875 A1 | 10/2010 | Zhao et al. |
| 2010/0271986 A1 | 10/2010 | Chen |
| 2010/0272051 A1 | 10/2010 | Fu et al. |
| 2010/0301946 A1 | 12/2010 | Borremans |
| 2010/0311378 A1 | 12/2010 | Tasic et al. |
| 2010/0328155 A1 | 12/2010 | Simic et al. |
| 2010/0330977 A1 | 12/2010 | Kadous et al. |
| 2011/0018635 A1 | 1/2011 | Tasic et al. |
| 2011/0044380 A1 | 2/2011 | Marra et al. |
| 2011/0050319 A1 | 3/2011 | Wong |
| 2011/0084791 A1 | 4/2011 | Mun et al. |
| 2011/0086603 A1 | 4/2011 | Toosi et al. |
| 2011/0110463 A1 | 5/2011 | Chang et al. |
| 2011/0122972 A1 | 5/2011 | Lie et al. |
| 2011/0165848 A1 | 7/2011 | Gorbachov et al. |
| 2011/0193625 A1 | 8/2011 | Gatta et al. |
| 2011/0194504 A1 | 8/2011 | Gorokhov et al. |
| 2011/0204973 A1 | 8/2011 | Hu et al. |
| 2011/0211533 A1 | 9/2011 | Casaccia et al. |
| 2011/0217945 A1 | 9/2011 | Uehara et al. |
| 2011/0222443 A1 | 9/2011 | Khlat |
| 2011/0222444 A1 | 9/2011 | Khlat et al. |
| 2011/0242999 A1 | 10/2011 | Palanki et al. |
| 2011/0250926 A1 | 10/2011 | Wietfeldt et al. |
| 2011/0268048 A1 | 11/2011 | Toskala et al. |
| 2011/0268232 A1 | 11/2011 | Park et al. |
| 2011/0292844 A1 | 12/2011 | Kwun et al. |
| 2011/0299434 A1 | 12/2011 | Gudem et al. |
| 2011/0300810 A1 | 12/2011 | Mikhemar et al. |
| 2012/0009886 A1 | 1/2012 | Poulin |
| 2012/0013387 A1 | 1/2012 | Sankaranarayanan et al. |
| 2012/0026862 A1 | 2/2012 | Sadri et al. |
| 2012/0044927 A1 | 2/2012 | Pan et al. |
| 2012/0056681 A1 | 3/2012 | Lee |
| 2012/0057621 A1 | 3/2012 | Hong et al. |
| 2012/0195237 A1 | 8/2012 | Chan et al. |
| 2012/0236829 A1 | 9/2012 | Takano et al. |
| 2012/0293265 A1 | 11/2012 | Heikkinen et al. |
| 2012/0294299 A1 | 11/2012 | Fernando |
| 2012/0327825 A1 | 12/2012 | Gudem et al. |
| 2012/0329395 A1 | 12/2012 | Husted et al. |
| 2013/0003617 A1 | 1/2013 | Gudem et al. |
| 2013/0003783 A1 | 1/2013 | Gudem et al. |
| 2013/0043946 A1 | 2/2013 | Hadjichristos et al. |
| 2013/0051284 A1 | 2/2013 | Khlat |
| 2013/0114769 A1 | 5/2013 | Fernando |
| 2013/0163492 A1 | 6/2013 | Wong |
| 2013/0217398 A1 | 8/2013 | Winiecki et al. |
| 2013/0230080 A1 | 9/2013 | Gudem et al. |
| 2013/0231064 A1 | 9/2013 | Gudem et al. |
| 2013/0265892 A1 | 10/2013 | Fernando |
| 2013/0315348 A1 | 11/2013 | Tasic et al. |
| 2013/0316669 A1 | 11/2013 | Davierwalla et al. |
| 2013/0316670 A1 | 11/2013 | Tasic et al. |
| 2013/0329665 A1 | 12/2013 | Kadous et al. |
| 2014/0072001 A1 | 3/2014 | Chang et al. |
| 2014/0113578 A1 | 4/2014 | Xu |
| 2014/0269853 A1 | 9/2014 | Gudem et al. |

FOREIGN PATENT DOCUMENTS

| | | |
|---|---|---|
| CN | 101228702 A | 7/2008 |
| CN | 101242158 A | 8/2008 |
| CN | 101523967 A | 9/2009 |
| CN | 101789805 A | 7/2010 |
| EP | 1164719 A1 | 12/2001 |
| EP | 1370012 | 12/2003 |
| EP | 1398887 A1 | 3/2004 |
| EP | 1708372 A2 | 10/2006 |
| EP | 1726098 A1 | 11/2006 |
| EP | 1748567 A2 | 1/2007 |
| EP | 1761076 A2 | 3/2007 |
| EP | 2068583 A1 | 6/2009 |
| EP | 2141818 A1 | 1/2010 |
| EP | 1916767 B1 | 12/2010 |
| EP | 2393205 A2 | 12/2011 |
| EP | 2398285 A1 | 12/2011 |
| GB | 2472978 A | 3/2011 |
| JP | 05227234 | 9/1993 |
| JP | H0730452 A | 1/1995 |
| JP | 07221684 | 8/1995 |
| JP | 9027778 A | 1/1997 |
| JP | 09116458 | 5/1997 |
| JP | H11127300 A | 5/1999 |
| JP | 2000013278 A | 1/2000 |
| JP | 2001285114 A | 10/2001 |
| JP | 2002261880 A | 9/2002 |

(56) References Cited

FOREIGN PATENT DOCUMENTS

| | | |
|---|---|---|
| JP | 2004015162 A | 1/2004 |
| JP | 2006520143 A | 8/2006 |
| JP | 2007324711 A | 12/2007 |
| JP | 2008085793 A | 4/2008 |
| JP | 2008519535 A | 6/2008 |
| JP | 2009027778 | 2/2009 |
| JP | 2009130867 A | 6/2009 |
| JP | 2011015112 A | 1/2011 |
| JP | 2011082669 A | 4/2011 |
| JP | 2011091747 A | 5/2011 |
| JP | 2011119807 A | 6/2011 |
| WO | 0150636 | 7/2001 |
| WO | 0237686 | 5/2002 |
| WO | 2005039060 | 4/2005 |
| WO | 2005062477 A2 | 7/2005 |
| WO | 2005088847 A1 | 9/2005 |
| WO | 2006050515 A2 | 5/2006 |
| WO | 2006118538 A2 | 11/2006 |
| WO | 2008059257 A1 | 5/2008 |
| WO | 2008084539 A1 | 7/2008 |
| WO | 2008092745 A1 | 8/2008 |
| WO | 2008103757 | 8/2008 |
| WO | 2008145604 A1 | 12/2008 |
| WO | 2010059257 A1 | 5/2010 |
| WO | 2011019850 A1 | 2/2011 |
| WO | 2011050729 A1 | 5/2011 |
| WO | 2011092005 A1 | 8/2011 |
| WO | 2011138697 A1 | 11/2011 |
| WO | 2012008705 A2 | 1/2012 |
| WO | 2012049529 A1 | 4/2012 |
| WO | 2013036794 A1 | 3/2013 |
| WO | 2013131047 | 9/2013 |

OTHER PUBLICATIONS

Chen, et al, "A 5-6 GHz 1-V CMOS Direct-Conversion Receiver With an Integrated Quadrature Coupler," IEEE Journal of Solid-State Circuits, vol. 42, No. 9, pp. 1963-1975, 2007.

Chen, et al., "A monolithic 5.9-GHz CMOS I/Q direct-down converter utilizing a quadrature coupler and transformer-coupled subharmonic mixers," Microwave and Wireless Components Letters, IEEE , vol. 16, No. 4, pp. 197-199, 2006.

Philips: "Capabilities of multi-transceiver UES", 3GPP Draft; R1-103913, 3rd Generation Partnership Project (3GPP), Mobile Competence Centre; 650, Route Des Lucioles; F-06921 Sophia-Antipolis Cedex; France, vol. RAN WG1, no. Dresden, Germany; 20100628, Jun. 22, 2010, XP050449298, [retrieved on Jun. 22, 2010] the whole document.

3GPP TS 36.101 V11.0.0, 3rd Generation Partnership Project; Technical Specification Group Radio Access Network; Evolved Universal Terrestrial Radio Access (E-UTRA); User Equipment (UE) radio transmission and reception (Release 11), Mar. 2012.

Aparin et al., "A Highly-integrated tri-band/quad-mode SiGe BiCMOS RF-to-baseband and receiver for wireless CDMA/ WCDMA/AMPS applications with GPS capability", Solid-State Circuits Conference, 2002. Digest of Technical Papers. 2002 IEEE International Feb. 3-7, 2002, Piscataway, NJ, USA, IEEE, vol. 1, 2002, pp. 234-235, XP010585547, ISBN: 0-7803-7335-9.

Broyde F., et al., "The Noise Performance of aMultiple-Input-Port and Multiple-Output-Port Low-Noise Amplifier Connected to an Array of Coupled Antennas," International Journal of Antennas and Propagation, vol. 2011, Article ID 438478, Jul. 18, 2011, 12 pages.

Garuda, et al., "A Multi-band CMOS RF Front-end for 4G WiMAX and WLAN Applications," 2006 IEEE International Symposium on Circuits and Systes, 2006. ISCAS 2006. May 2006, 4 pages.

Hashemi, et al., "Concurrent Multiband Low-Noise Amplifiers—Theory, Design, and Applications," IEEE Transactions on Microwave Theory and Techniques, vol. 50, No. 1, Jan. 2002.

Henrik M et al., "A Full Duplex Front End Module for WiFi 802.11.n Applications", European Microwave Association, vol. 12, No. 4, Oct. 2008, pp. 162-165.

Hwang, et al., "A High IIP2 Direct-Conversion Receiver using Even-Harmonic Reduction Technique for Cellular CDMA/PCS/GPS applications," IEEE Transaction on Circuits and Systems, Oct. 29, 2008.

Jones W. W., et al., "Narrowband interference suppression using filter-bank analysis/synthesis techniques", Military Communications Conference, 1992. MILCOM '92, Conference REC0R D. Communications—Fusing Command, Control and Intelligence., IEEE San Diego, CA, USA, Oct. 11-14, 1992, New York, NY, USA, IEEE, US, Oct. 11, 1992, pp. 898-902, XP010060840, DOI: 10.1109/ MILCOM.1992.243977, ISBN: 978-0-7803-0585-4.

Jussi R et al., "A Dual-Band RF Front-End for WCDMA and GSM Applications", IEEE, Journal Solid-State Circuits, 2001, vol. 36, No. 8, pp. 1198-1204, May 21, 2000.

Kevin W et al., "3G/4G Multimode Cellular Front End Challenges", Part 2: Architecture Discussion, RFMD® White Paper, 9 pages, Jan. 12, 2009.

Kim, T.W., et al., Highly Linear Receiver Front-End Adopting MOSFET Transconductance Linearization by Multiple Gated Transistors, IEEE Journal of Solid-State Circuits, United States, IEEE, Jan. 1, 2004, vol. 39, No. 1, pp. 223-229.

Lai, C.M.,et al., "Compact router transceiver architecture for carrier aggregation systems", Microwave Conference (EUMC), 2011 41st European, IEEE, Oct. 10, 2011, pp. 693-696, XP032072825, ISBN: 978-1-61284-235-6 the whole document.

Lee et al., "Development of Miniature Quad SAW filter bank based on PCB substrate", IEEE Intl Frequency Control Symp, pp. 146-149, 2007, May 29, 2007.

MSM6000 Chipset Solution, Qualcomm Incorporated, Jan. 7, 2002.
MSM6500 Chipset Solution, Qualcomm Incorporated, Jul. 20, 2007.

Pitschi M. et al., "High Performance Microwave Acoustic Components for Mobile Radios", Ultrasonics Symposium (IUS), 2009 IEEE International, EPCOS AG, Munich, Germany, vol. 1, Sep. 20-23, 2009.

Qualcomm Europe: "UE Implementation Impact due to 4C-HSDPA Operation", 3GPP Draft; R1-094067_UE_IMPL_IMPACT_4C_ HSDPA, 3rd Generation Partnership Project (3GPP), Mobile Competence Centre ; 650, Route Des LUCI0LES ; F-06921 Sophia-ANTIP0LIS Cedex ; France, no. Miyazaki; 20091012, Oct. 12, 2009, XP050388547, [retrieved on Oct. 6, 2009].

Rahn D.G., et al., "A fully integrated multiband MIMO WLAN transceiver RFIC," IEEE J. Solid-State Circuits, 2005, vol. 40 (8), 1629-1641, Jun. 16-18, 2005.

Sever et al. "A Dual-Antenna Phase-Array Ultra-Wideband CMOS Transceiver". IEEE Communications Magazine [Online] 2006, vol. 44, Issue 8, pp. 102-110. See pp. 104-107, Aug. 21, 2006.

Tasic A. et al., "Design of Adaptive Multimode RF Front-End Circuits", IEEE Journal of Solid-State Circuits, vol. 42, Issue 2, Feb. 2007 pp. 313-322.

"UMTS Picocell Front End Module", CTS Corp. 8 pages, Apr. 16, 2007.

Winternitz, et al., "A GPS Receiver for High-Altitude Satellite Navigation," IEEE Journal of Selected Topics in Signal Processing, vol. 3, No. 4, pp. 541-556, Aug. 2009.

* cited by examiner

LOW NOISE AMPLIFIERS WITH TRANSFORMER-BASED SIGNAL SPLITTING FOR CARRIER AGGREGATION

CLAIM OF PRIORITY UNDER 35 U.S.C. §119

The present application for patent claims priority to Provisional U.S. Application Ser. No. 61/652,064, entitled "LOW NOISE AMPLIFIERS FOR CARRIER AGGREGATION," filed May 25, 2012 assigned to the assignee hereof, and expressly incorporated herein by reference.

BACKGROUND

I. Field

The present disclosure relates generally to electronics, and more specifically to low noise amplifiers (LNAs).

II. Background

A wireless device (e.g., a cellular phone or a smartphone) in a wireless communication system may transmit and receive data for two-way communication. The wireless device may include a transmitter for data transmission and a receiver for data reception. For data transmission, the transmitter may modulate a radio frequency (RF) carrier signal with data to obtain a modulated RF signal, amplify the modulated RF signal to obtain an amplified RF signal having the proper output power level, and transmit the amplified RF signal via an antenna to a base station. For data reception, the receiver may obtain a received RF signal via the antenna and may amplify and process the received RF signal to recover data sent by the base station.

A wireless device may support carrier aggregation, which is simultaneous operation on multiple carriers. A carrier may refer to a range of frequencies used for communication and may be associated with certain characteristics. For example, a carrier may be associated with system information describing operation on the carrier. A carrier may also be referred to as a component carrier (CC), a frequency channel, a cell, etc. It is desirable to efficiently support carrier aggregation by the wireless device.

DETAILED DESCRIPTION

The detailed description set forth below is intended as a description of exemplary designs of the present disclosure and is not intended to represent the only designs in which the present disclosure can be practiced. The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

LNAs with transformer-based signal splitting for carrier aggregation are disclosed herein. These LNAs may be used for various types of electronic devices such as wireless communication devices.

Figure 1:
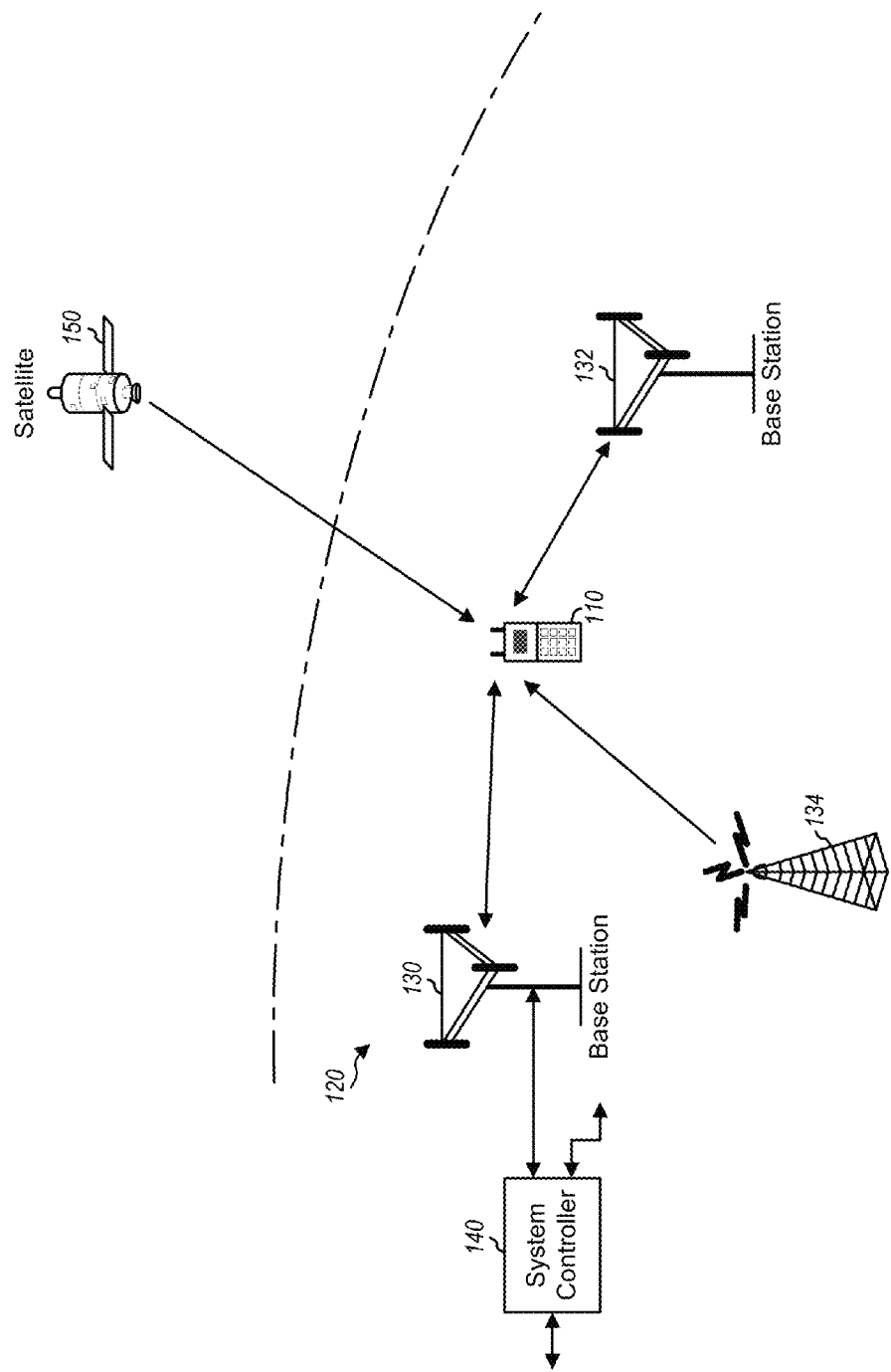
FIG. 1 shows a wireless device communicating with a wireless system.

FIG. 1 shows a wireless device 110 communicating with a wireless communication system 120. Wireless system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), Time Division Synchronous CDMA (TD-SCDMA), cdma2000, or some other version of CDMA. For simplicity, FIG. 1 shows wireless system 120 including two base stations 130 and 132 and one system controller 140. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may be capable of communicating with wireless system 120. Wireless device 110 may also be capable of receiving signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, cdma2000, WCDMA, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band from 698 to 960 megahertz (MHz), mid-band from 1475 to 2170 MHz, and/or high-band from 2300 to 2690 and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to 5 carriers in one or two bands in LTE Release 11.

In general, carrier aggregation (CA) may be categorized into two types—intra-band CA and inter-band CA. Intra-band CA refers to operation on multiple carriers within the same band. Inter-band CA refers to operation on multiple carriers in different bands.

Figure 2:
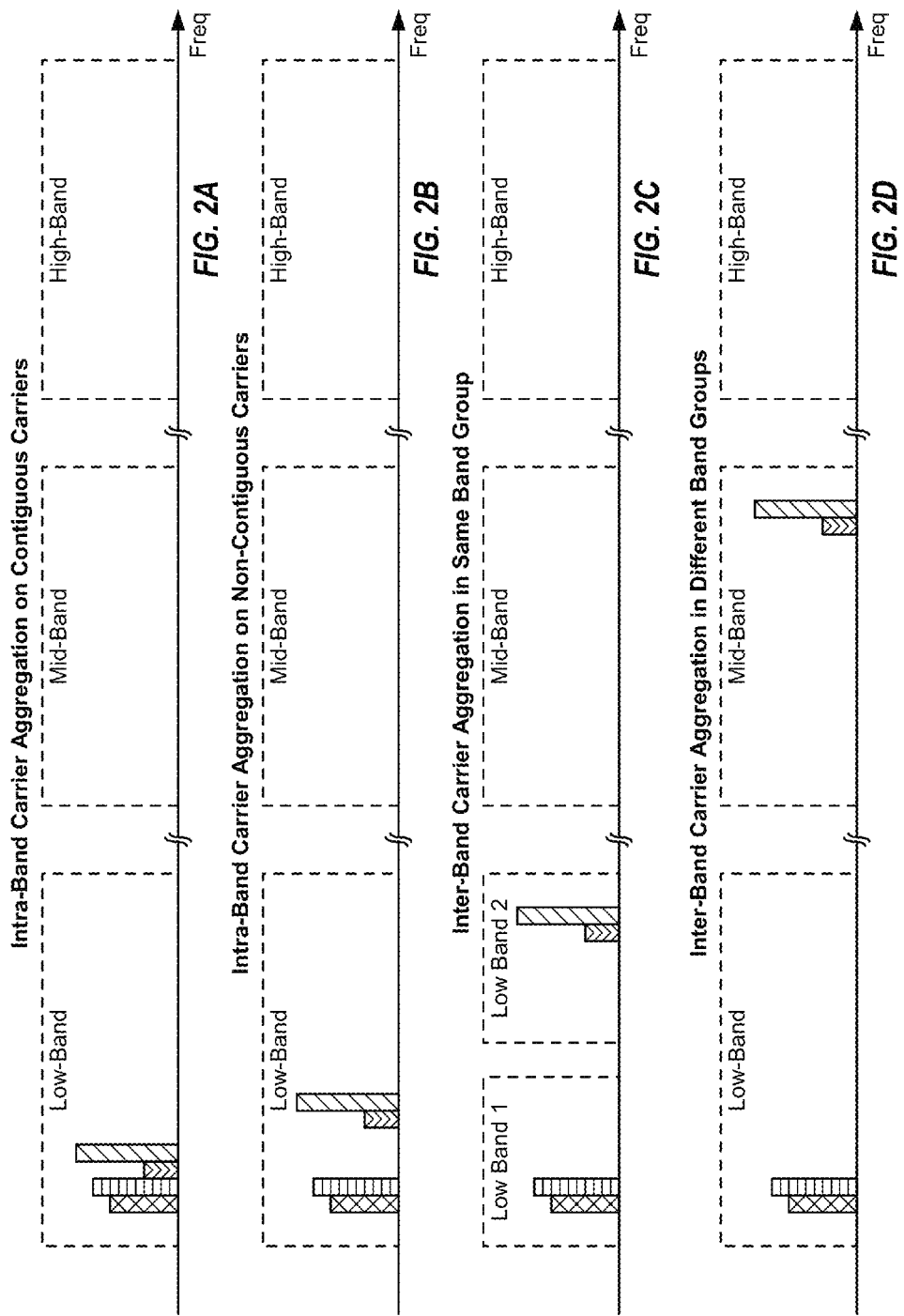
FIGS. 2A to 2D show four examples of carrier aggregation (CA).

FIG. 2A shows an example of contiguous intra-band CA. In the example shown in FIG. 2A, wireless device 110 is configured with four contiguous carriers in the same band, which is a band in low-band. Wireless device 110 may receive transmissions on multiple contiguous carriers within the same band.

FIG. 2B shows an example of non-contiguous intra-band CA. In the example shown in FIG. 2B, wireless device 110 is configured with four non-contiguous carriers in the same band, which is a band in low-band. The carriers may be separated by 5 MHz, 10 MHz, or some other amount. Wireless device 110 may receive transmissions on multiple non-contiguous carriers within the same band.

FIG. 2C shows an example of inter-band CA in the same band group. In the example shown in FIG. 2C, wireless device 110 is configured with four carriers in two bands in the same band group, which is low-band. Wireless device 110 may receive transmissions on multiple carriers in different bands in the same band group (e.g., low-band in FIG. 2C).

FIG. 2D shows an example of inter-band CA in different band groups. In the example shown in FIG. 2D, wireless device 110 is configured with four carriers in two bands in different band groups, which include two carriers in one band in low-band and two additional carriers in another band in mid-band. Wireless device 110 may receive transmissions on multiple carriers in different bands in different band groups (e.g., low-band and mid-band in FIG. 2D).

FIGS. 2A to 2D show four examples of carrier aggregation. Carrier aggregation may also be supported for other combinations of bands and band groups. For example, carrier aggregation may be supported for low-band and high-band, mid-band and high-band, high-band and high-band, etc.

Figure 3:
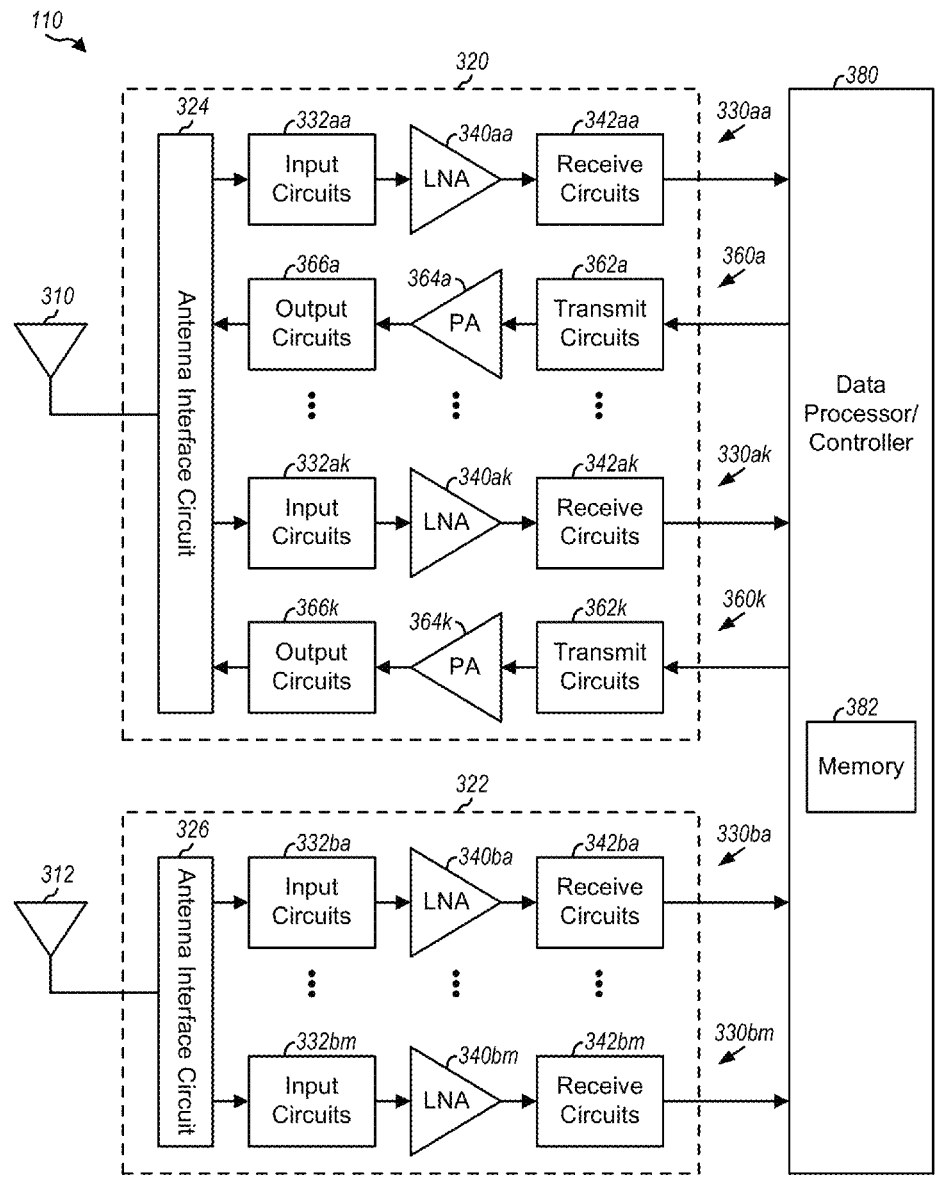
FIG. 3 shows a block diagram of the wireless device in FIG. 1.

FIG. 3 shows a block diagram of an exemplary design of wireless device 110 in FIG. 1. In this exemplary design, wireless device 110 includes a transceiver 320 coupled to a primary antenna 310, receivers 322 coupled to a secondary antenna 312, and a data processor/controller 380. Transceiver 320 includes multiple (K) receivers 330aa to 330ak and multiple (K) transmitters 360a to 360k to support multiple bands, carrier aggregation, multiple radio technologies, etc. Receivers 322 include multiple (M) receivers 330ba to 330bm to support multiple bands, carrier aggregation, multiple radio technologies, receive diversity, multiple-input multiple-output (MIMO) transmission from multiple transmit antennas to multiple receive antennas, etc.

In the exemplary design shown in FIG. 3, each receiver 330 includes input circuits 332, an LNA 340, and receive circuits 342. For data reception, antenna 310 receives signals from base stations and/or other transmitter stations and provides a received RF signal, which is routed through an antenna interface circuit 324 and provided to a selected receiver. Antenna interface circuit 324 may include switches, duplexers, transmit filters, receive filters, etc. The description below assumes that receiver 330aa is the selected receiver. Within receiver 330aa, the received RF signal is passed through input circuits 332aa, which provides an input RF signal to an LNA 340aa. Input circuits 332aa may include a matching circuit, a receive filter, etc. LNA 340aa amplifies the input RF signal and provides an output RF signal. Receive circuits 342aa amplify, filter, and downconvert the output RF signal from RF to baseband and provide an analog input signal to data processor 380. Receive circuits 332aa may include mixers, filters, amplifiers, matching circuits, an oscillator, a local oscillator (LO) generator, a phase locked loop (PLL), etc. Each remaining receiver 330 in transceiver 320 and each receiver 330 in receivers 322 may operate in similar manner as receiver 330aa in transceiver 320.

In the exemplary design shown in FIG. 3, each transmitter 360 includes transmit circuits 362, a power amplifier (PA) 364, and output circuits 366. For data transmission, data processor 380 processes (e.g., encodes and modulates) data to be transmitted and provides an analog output signal to a selected transmitter. The description below assumes that transmitter 360a is the selected transmitter. Within transmitter 360a, transmit circuits 362a amplify, filter, and upconvert the analog output signal from baseband to RF and provide a modulated RF signal. Transmit circuits 362a may include amplifiers, filters, mixers, matching circuits, an oscillator, an LO generator, a PLL, etc. A PA 364a receives and amplifies the modulated RF signal and provides a transmit RF signal having the proper output power level. The transmit RF signal is passed through output circuits 366a, routed through antenna interface circuit 324, and transmitted via antenna 310. Output circuits 366a may include a matching circuit, a transmit filter, a directional coupler, etc.

FIG. 3 shows an exemplary design of receivers 330 and transmitters 360. A receiver and a transmitter may also include other circuits not shown in FIG. 3, such as filters, matching circuits, etc. All or a portion of transceiver 320 and receivers 322 may be implemented on one or more analog integrated circuits (ICs), RF ICs (RFICs), mixed-signal ICs, etc. For example, LNAs 340, receive circuits 342, and transmit circuits 362 may be implemented on one module, which may be an RFIC, etc. Antenna interface circuits 324 and 326, input circuits 332, output circuits 366, and PAs 364 may be implemented on another module, which may be a hybrid module, etc. The circuits in receivers 330 and transmitters 360 may also be implemented in other manners.

Data processor/controller 380 may perform various functions for wireless device 110. For example, data processor 380 may perform processing for data being received via receivers 330 and data being transmitted via transmitters 360. Controller 380 may control the operation of antenna interface circuits 324 and 326, input circuits 332, LNAs 340, receive circuits 342, transmit circuits 362, PAs 364, output circuits 366, or a combination thereof. A memory 382 may store program codes and data for data processor/controller 380. Data processor/controller 380 may be implemented on one or more application specific integrated circuits (ASICs) and/or other ICs.

Figure 4:
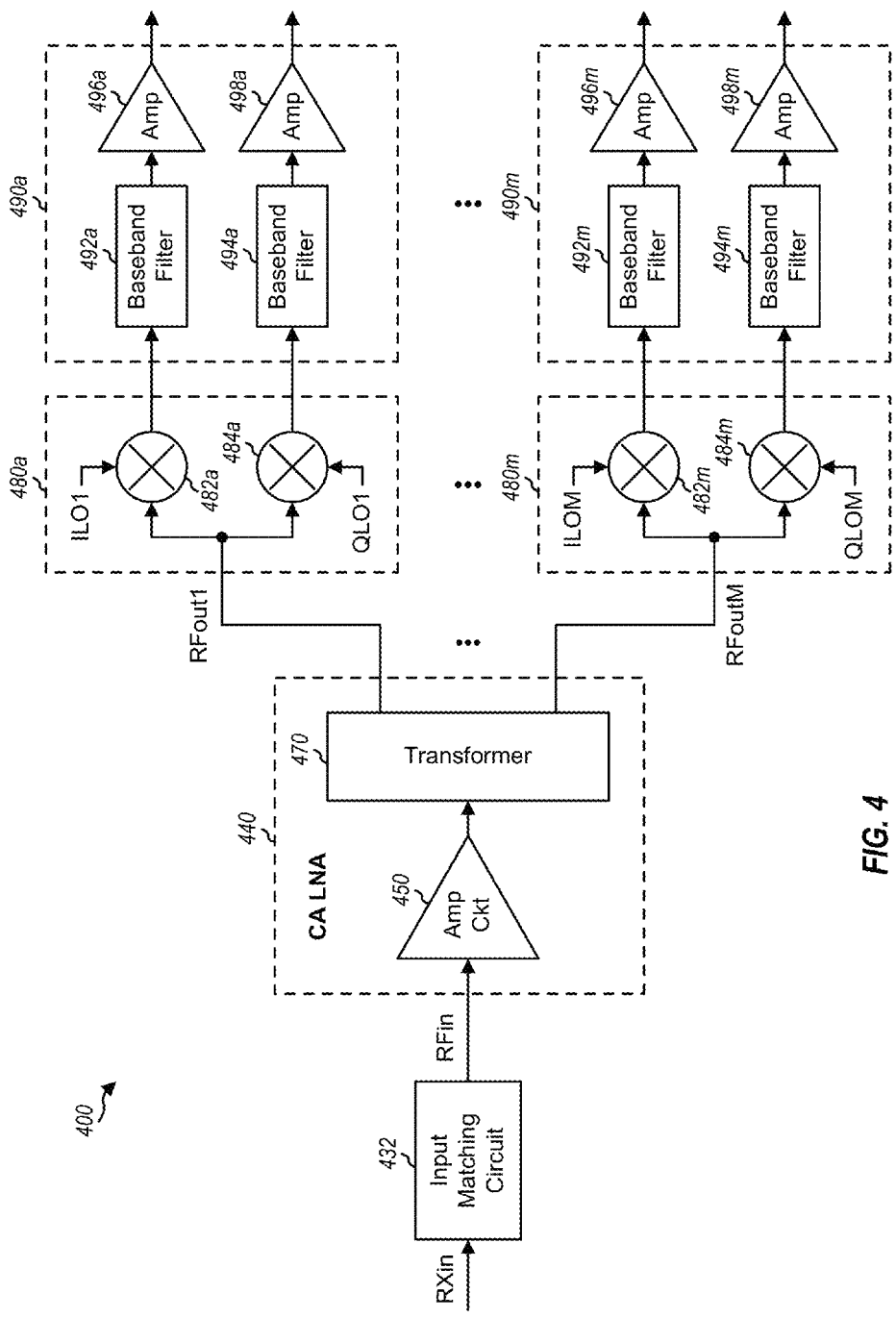
FIG. 4 shows a receiver supporting CA.

FIG. 4 shows a block diagram of an exemplary design of a CA receiver 400 with a CA LNA 440. CA LNA 440 may be used for one or more LNAs 340 in FIG. 3. CA LNA 440 includes a single input and multiple (M) outputs and may be referred to as a 1×M LNA, where M>1.

Within CA receiver 400, an input matching circuit 432 receives a receiver input signal, RXin, and provides an input RF signal, RFin, to CA LNA 440. Matching circuit 432 performs impedance and/or power matching between CA LNA 440 and either an antenna interface circuit or an antenna for a band of interest. Matching circuit 432 may be part of one of input circuits 332 in FIG. 3.

In the exemplary design shown in FIG. 4, CA LNA 440 includes an amplifier circuit (Amp Ckt) 450 and a transformer 470. An amplifier circuit may also be referred to as an amplifier stage, an input stage, a gain circuit, etc. Amplifier circuit 450 amplifies the input RF signal from matching circuit 432 and provides an amplified RF signal. Transformer 470 receives the amplified RF signal and provides M output RF signals to M downconverters 480a to 480m. The input RF signal may comprise transmissions on M sets of carriers, with each set including one or more carriers. CA LNA 440 provides M output RF signals for the M sets of carriers, one output RF signal for each set of carriers being received.

In the exemplary design shown in FIG. 4, each downconverter 480 includes two mixers 482 and 484. Within downconverter 480a, a mixer 482a receives a first output RF signal, RFout1, from transformer 470 and an inphase LO signal, ILO1, at a first mixing frequency for a first set of carriers. Mixer 482a downconverts the first output RF signal with the ILO1 signal and provides an inphase (I) downconverted signal. A mixer 484a receives the first output RF signal from transformer 470 and a quadrature LO signal, QLO1, at the first mixing frequency. Mixer 484a downconverts the first output RF signal with the QLO1 signal and provides a quadrature (Q) downconverted signal.

Baseband circuits 490a to 490m are coupled to downconverters 480a to 480m, respectively. Each baseband circuit 490 may include filters 492 and 494 and amplifiers 496 and 498. Within baseband circuit 490a, filters 492a and 494a receive and filter the I and Q downconverted signals from mixers 482a and 484a, respectively, and provide I and Q filtered signals. Amplifiers 496a and 498a amplify the I and Q filtered signals and provide I and Q baseband signals for the first set of carriers.

Downconverters 480a to 480m may be enabled to receive transmissions on M sets of carriers. Each downconverter 480 may receive a respective output RF signal from transformer 470, downconvert its output RF signal with a respective LO signal at a suitable mixing frequency, and provide I and Q downconverted signals for one set of carriers. Downconverters 480a to 480m may downconvert their M output RF signals with M LO signals at different mixing frequencies for M sets of carriers being received.

FIG. 4 shows an exemplary design of downconverters 480 and baseband circuits 490. A downconverter and a baseband circuit may also include different and/or additional circuits. For example, a downconverter may include amplifiers coupled before the mixers. A baseband circuit may include amplifiers before the filters, or additional mixers to further downconvert the I and Q downconverted signals from an intermediate frequency (IF) to baseband, or other circuits.

FIG. 4 shows an exemplary design of CA LNA 440 with one amplifier circuit 450 and one transformer 470. A CA LNA may also include multiple amplifier circuits and/or multiple transformers. For example, a CA LNA may include one amplifier circuit coupled to multiple transformers. Each transformer may provide one or more output RF signals.

CA LNA 440 in FIG. 4 may be implemented with various circuit architectures. Some exemplary designs of CA LNA 440 are described below. CA LNA 440 may also be implemented with transistors of various types. Some exemplary designs of CA LNA 440 implemented with N-channel metal oxide semiconductor (NMOS) transistors are described below.

Figure 5:
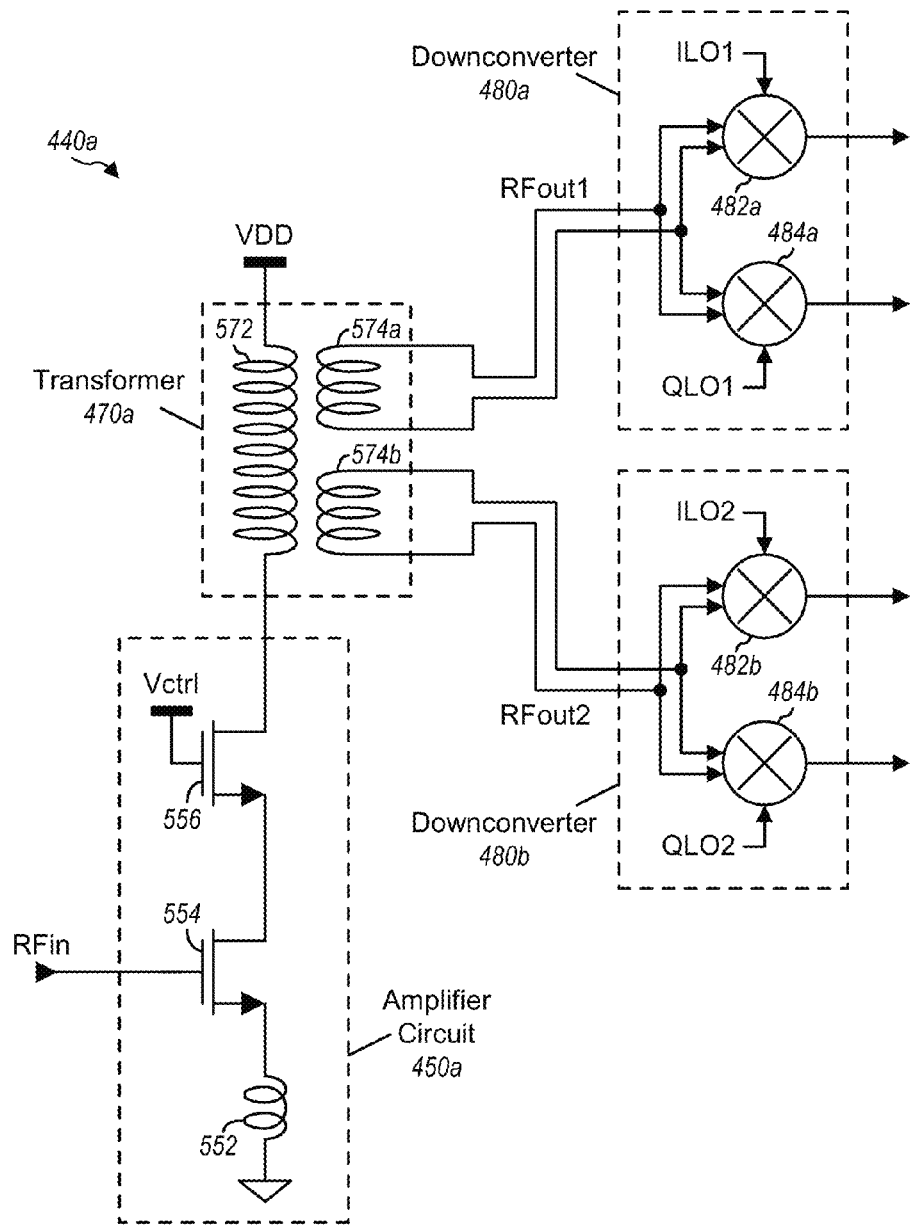
FIGS. 5 to 10 show various exemplary designs a CA LNA with transformer-based signal splitting to support CA.

FIG. 5 shows a schematic diagram of an exemplary design of a CA LNA 440a with inductive degeneration and transformer-based signal splitting. CA LNA 440a is one exemplary design of CA LNA 440 in FIG. 4. CA LNA 440a includes an amplifier circuit 450a and a transformer 470a, which are one exemplary design of amplifier circuit 450 and transformer 470 in FIG. 4

In the exemplary design shown in FIG. 5, amplifier circuit 450a includes a source degeneration inductor 552, a gain transistor 554, and a cascode transistor 556. Gain transistor 554 has its gate receiving an input RF signal and its source coupled to one end of inductor 552. The other end of inductor 552 is coupled to circuit ground. Cascode transistor 556 has its source coupled to the drain of gain transistor 554, its gate receiving a control signal, Vctrl, and its drain coupled to transformer 470a. Gain transistor 554 and cascode transistor 556 may be implemented with NMOS transistors, as shown in FIG. 5, or with transistors of other types.

In the exemplary design shown in FIG. 5, transformer 470a includes a primary coil 572 and two secondary coils 574a and 574b. A coil may also be referred to as an inductor coil, a winding, a conductor, etc. Primary coil 572 has one end coupled to the drain of cascode transistor 556 and the other end coupled to a power supply, VDD. Secondary coils 574a and 574b are magnetically coupled to primary coil 572. Secondary coil 574a provides a first differential output RF signal for a first set of carriers to downconverter 480a. Secondary coil 574b provides a second differential output RF signal for a second set of carriers to a downconverter 480b. In an exemplary design, secondary coils 574a and 574b may be symmetric with respect to each other.

FIG. 5 shows an exemplary design in which amplifier circuit 450a and downconverters 480a and 480b, and no other circuit components, are coupled to transformer 470a. In another exemplary design, a capacitor may be coupled in parallel with primary coil 572. Alternatively or additionally, a capacitor may be coupled in parallel with each secondary coil 574 or with only one secondary coil 574. Each capacitor may have a suitable value, which may be selected based on various factors such as a desired band or frequency of operation, the inductance of a coil coupled in parallel with the capacitor, etc.

In the exemplary design shown in FIG. 5, inductively degenerated amplifier circuit 450a amplifies the input RF signal and provides RF current to primary coil 572 of transformer 470a. Secondary coils 574a and 574b are magnetically coupled with primary coil 572 and provides two output RF signals to two downconverters 480a and 480b. Since transformer 470a acts as a load for amplifier circuit 450a, signal splitting is achieved at the load. Each downconverter 480 downconverts a respective output RF signal with a pair of mixers 482 and 484 at a frequency determined based on a set of carriers being received by that downconverter. The two downconverters 480a and 480b downconvert the two output RF signals with LO signals at different frequencies.

A non-CA receiver may include a 3-coil transformer coupled to a single downconverter. The 3-coil transformer may include a primary coil and two secondary coils. The downconverter may include an I mixer and a Q mixer. One secondary coil may be coupled to the I mixer and may provide a first output RF signal to the I mixer. The other secondary coil may be coupled to the Q mixer and may provide a second output RF signal to the Q mixer. The I and Q mixers may downconvert the two output RF signals with ILO and QLO signals, respectively, at the same frequency.

CA receiver 400 in FIGS. 4 and 5 is different from the non-CA receiver described above in several ways. First, the two secondary coils 574a and 574b in CA receiver 400 drive two downconverters 480a and 480b, with each downconverter 480 including I and Q mixers. In contrast, the two secondary coils in the non-CA receiver drive a single downconverter. Second, the two output RF signals from secondary coils 574a and 574b in CA receiver 400 are downconverted with LO signals at different frequencies for two sets of carriers being received, with each LO signal comprising ILO and QLO signals that are 90 degrees out of phase. In contrast, the two output RF signals from the secondary coils in the non-CA receiver are downconverted with a single LO signal comprising ILO and QLO signals at the same frequency.

Figure 6:
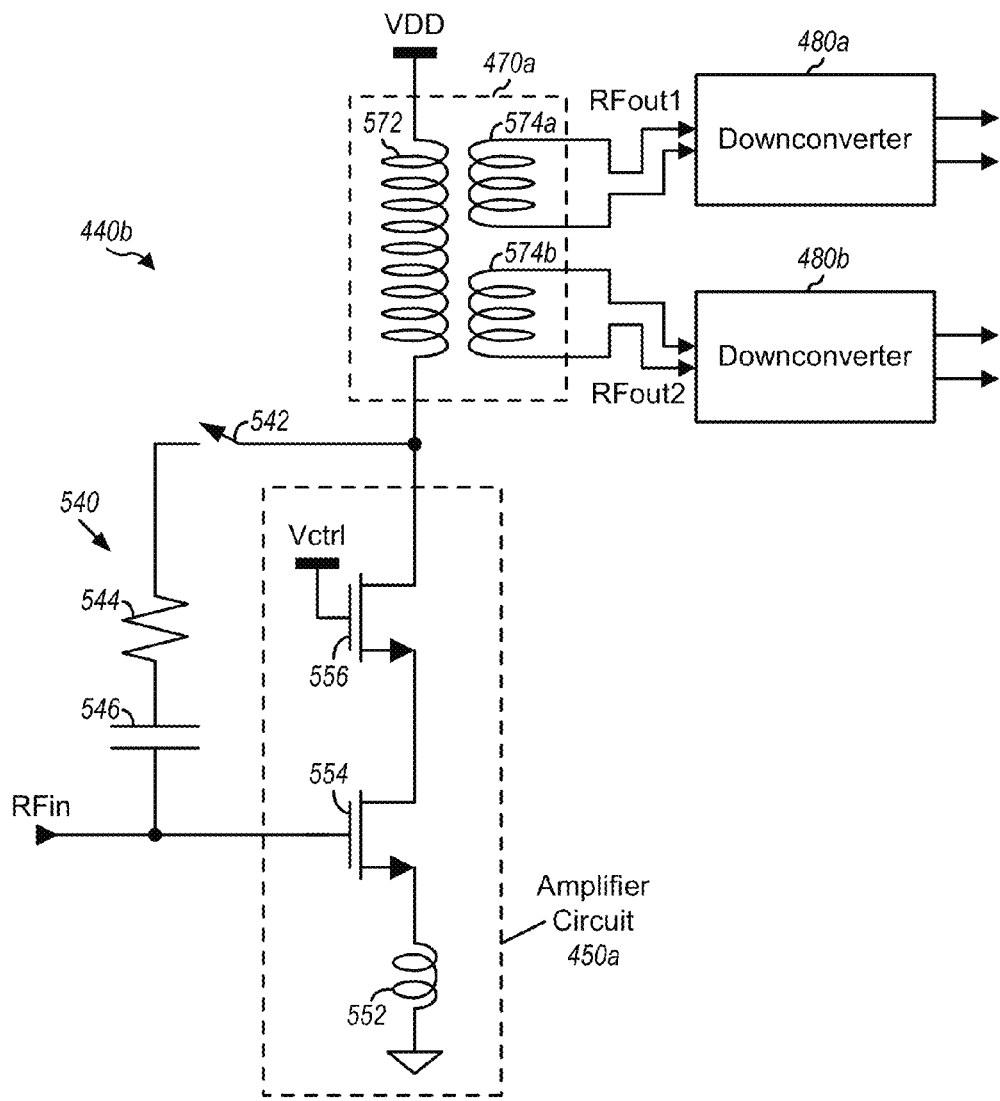

FIG. 6 shows a schematic diagram of an exemplary design of a CA LNA 440b with inductive degeneration, transformer-based signal splitting, and feedback. CA LNA 440b is another exemplary design of CA LNA 440 in FIG. 4. CA LNA 440b includes amplifier circuit 450a and transformer 470a, similar to CA LNA 440a in FIG. 5. CA LNA 440b further includes a feedback circuit 540 coupled between the drain of cascode transistor 556 and the gate of gain transistor 554, i.e., between the input and output of amplifier circuit 450a.

In the exemplary design shown in FIG. 6, feedback circuit 540 includes a switch 542, a resistor 544, and a capacitor 546 coupled in series. The bottom terminal of capacitor 546 is coupled to the gate of gain transistor 554. Switch 542 is coupled between the drain of cascode transistor 556 and the top terminal of resistor 544. Switch 542 may be closed to connect feedback circuit 540 to amplifier circuit 450a or may be opened to disconnect feedback circuit 540 from amplifier circuit 450a. Feedback circuit 540 may also include one or more active circuits such as a transistor. In an exemplary design, feedback circuit 540 may be enabled and used for low-band to provide input power match. For mid-band and high-band, feedback circuit 540 may be disabled, and source degeneration inductor 552 may be used with input matching circuit 432 for input power match. Feedback circuit 540 may also be used in other manners.

Feedback circuit 540 may help with input matching. In particular, input matching for CA LNA 440b may be achieved with feedback circuit 540 around amplifier circuit 450a as well as source degeneration inductor 552.

Feedback circuit 540 may also improve the linearity of amplifier circuit 450a. In particular, amplifier circuit 450a may be linearized by (i) both source degeneration inductor 552 and feedback circuit 540 when feedback circuit 540 is selected or (ii) only source degeneration inductor 552 when feedback circuit 540 is not selected. With the aid of feedback circuit 540, a smaller inductor 552 may be used to obtain the desired linearity for amplifier circuit 450a.

Figure 7:
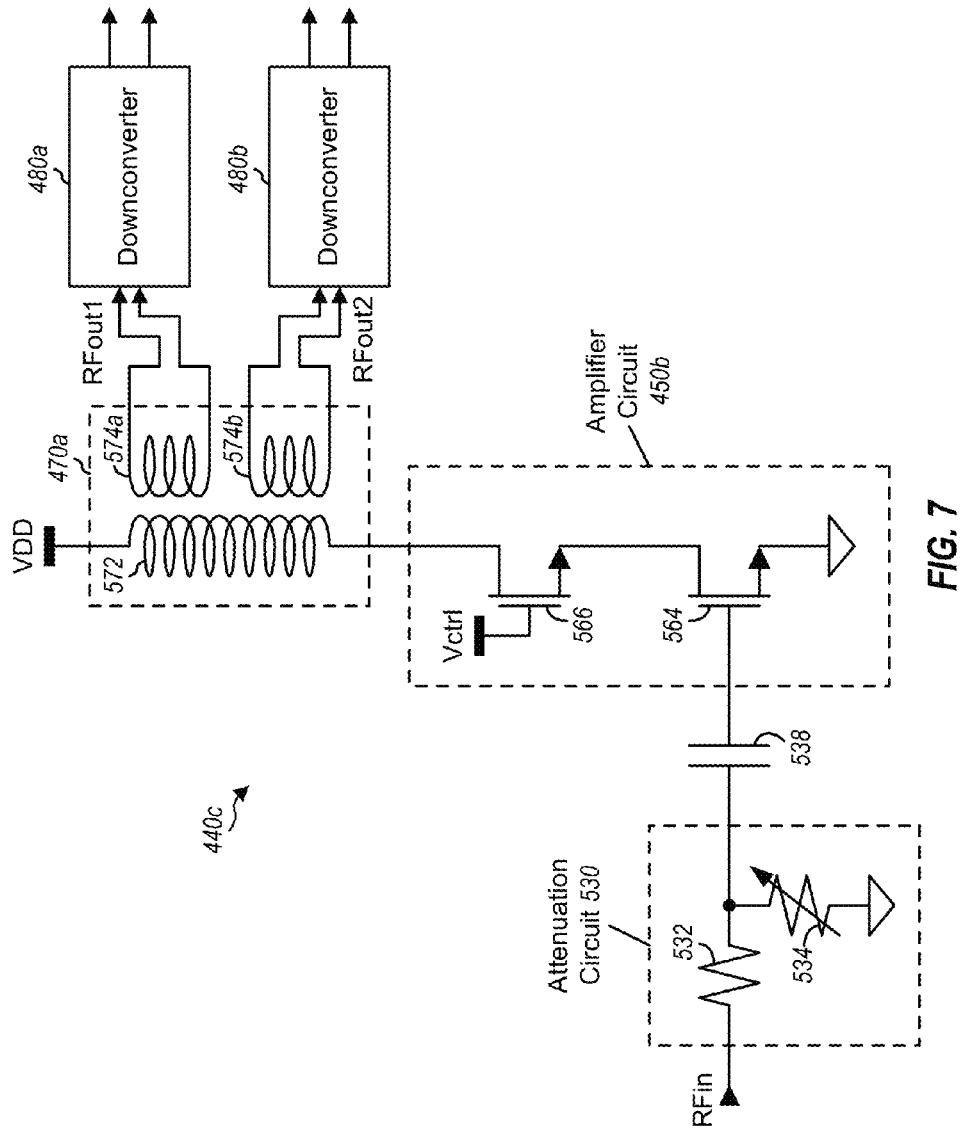

FIG. 7 shows a schematic diagram of an exemplary design of a CA LNA 440c with no source degeneration inductor and transformer-based signal splitting. CA LNA 440c is yet another exemplary design of CA LNA 440 in FIG. 4. CA LNA 440c includes an amplifier circuit 450b and transformer 470a.

An attenuation circuit 530 receives an input RF signal and provides an attenuated input RF signal to CA LNA 440c. Attenuation circuit 530 includes (i) a resistor 532 coupled between the input and output of attenuation circuit 530 and (ii) a variable resistor 534 coupled between the output of attenuation circuit 530 and circuit ground. An AC coupling capacitor 538 is coupled between the output of attenuation circuit 530 and the input of amplifier circuit 450b.

Amplifier circuit 450b includes a gain transistor 564 and a cascode transistor 566. Gain transistor 564 has its gate coupled to AC coupling capacitor 538 and its source coupled to circuit ground (as shown in FIG. 7) or to a source degeneration inductor (not shown in FIG. 7). Cascode transistor 566 has its gate receiving a Vctrl signal, its source coupled to the drain of gain transistor 564, and its drain coupled to transformer 470a.

CA LNA 440c may be advantageously used in a scenario in which the input RF signal includes jammers, which are large undesired signals close in frequency to desired signals. Attenuation circuit 530 may be programmable (e.g., as shown in FIG. 7) or may be fixed (not shown in FIG. 7). Attenuation circuit 530 may serve a dual purpose of attenuating the jammers in the input RF signal and providing a good input match for CA LNA 440c.

Figure 8:
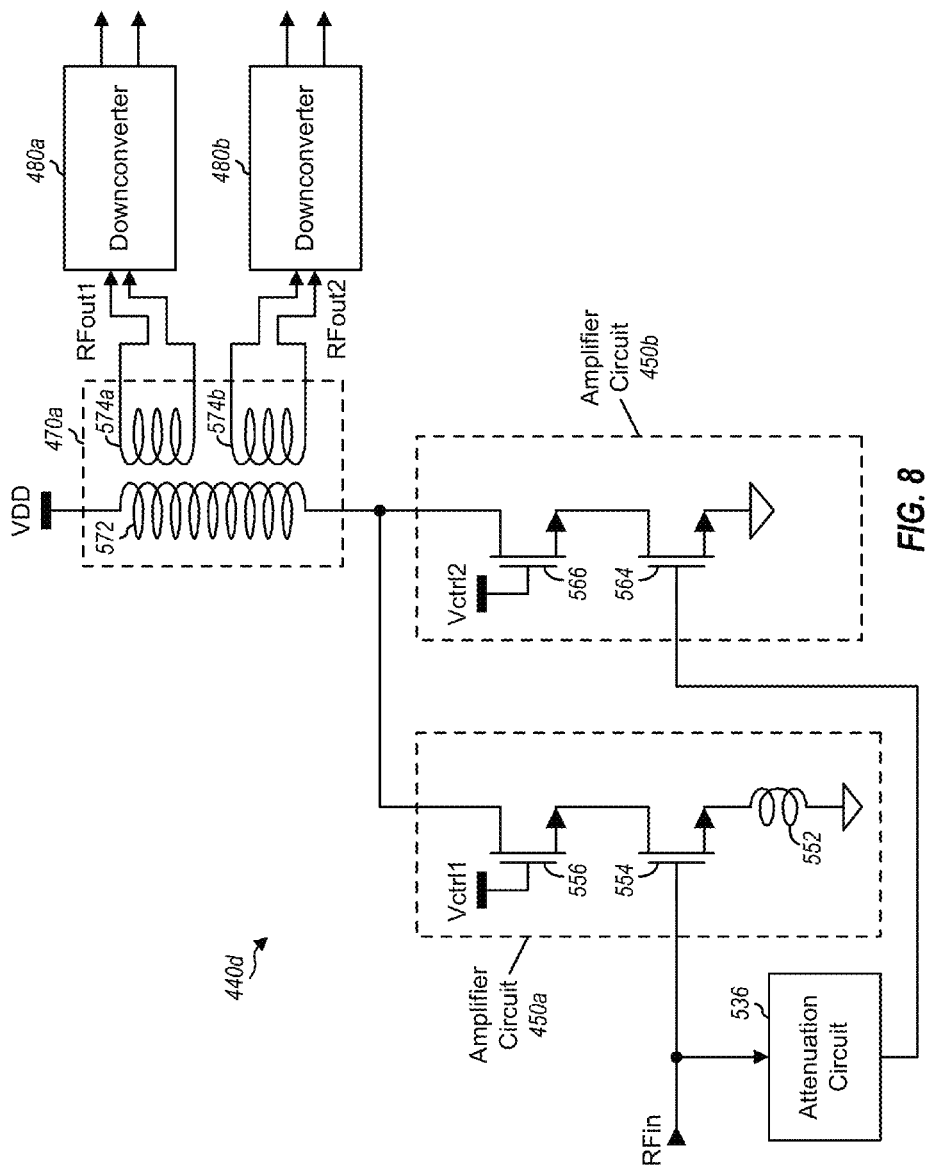

FIG. 8 shows a schematic diagram of an exemplary design of a CA LNA 440d with high-gain and low-gain amplifier circuits and transformer-based signal splitting. CA LNA 440d is yet another exemplary design of CA LNA 440 in FIG. 4. CA LNA 440d includes high-gain amplifier circuit 450a, low-gain amplifier circuit 450b, and transformer 470a. An input RF signal is provided to the gate of gain transistor 554 within amplifier circuit 450a. The input RF signal is also provided to an attenuation circuit 536, which provides an attenuated input RF signal to the gate of gain transistor 564. Attenuation circuit 536 may include attenuation circuit 530 and AC coupling capacitor 538 in FIG. 7.

Amplifier circuit 450a may be selected to amplify the input RF signal and provide an amplified RF signal to transformer 470a when the input RF signal is small and high gain is desired. The input RF signal may be deemed to be small if its received power is less than a first threshold. Amplifier circuit 450b may be selected to amplify the input RF signal and provide an amplified RF signal to transformer 470a when the input RF signal is large and/or jammers are present and low gain is desired. The input RF signal may be deemed to be large if its received power is greater than a second threshold. The second threshold may be (i) equal to the first threshold if hysteresis is not desired or (ii) higher than the first threshold to provide hysteresis. Hysteresis may be used to avoid or mitigate continual switching between amplifier circuits 450a and 450b when the received power of the input RF signal is close to the first and/or second thresholds.

Figure 9:
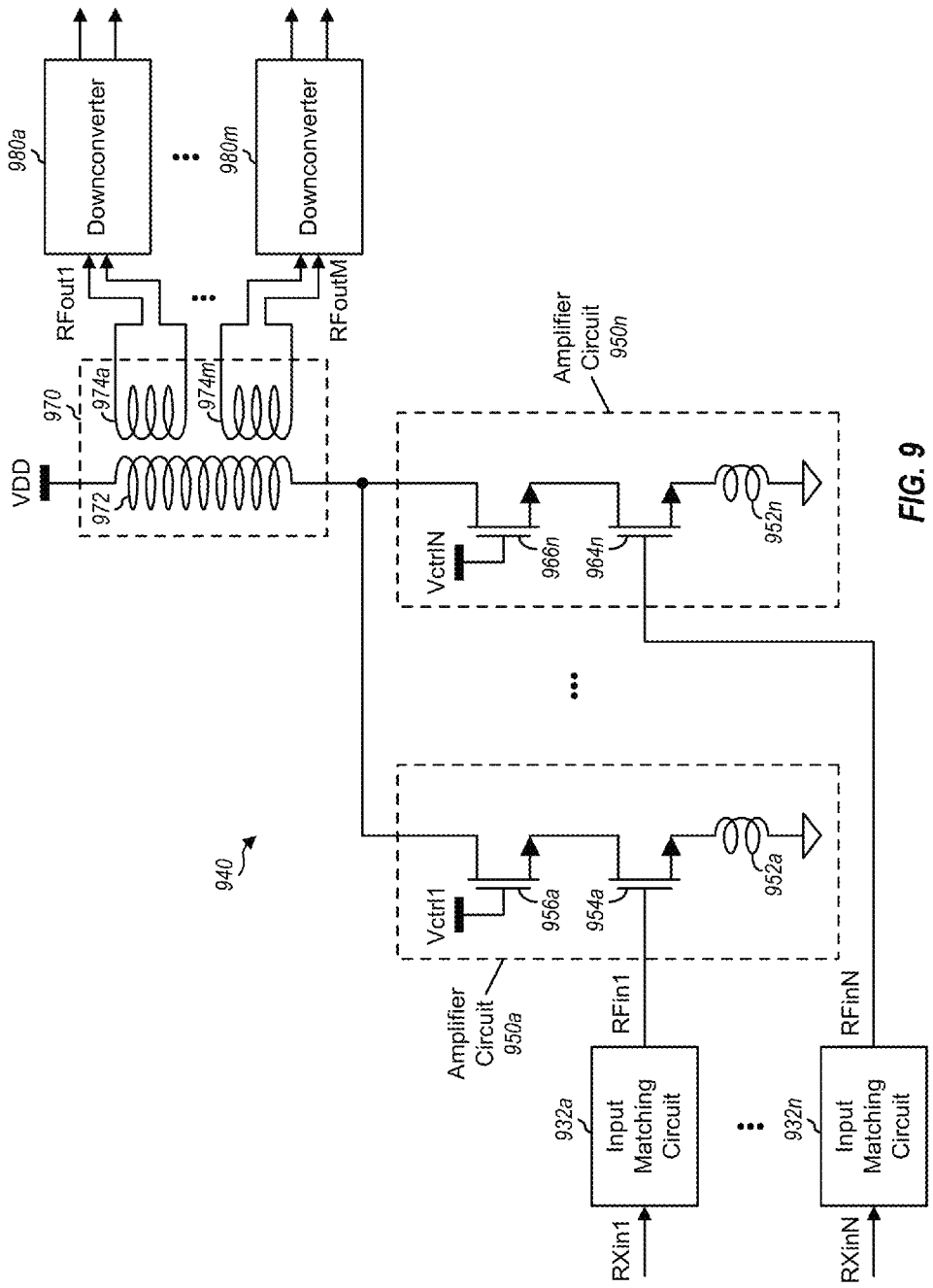

FIG. 9 shows a schematic diagram of an exemplary design of a CA LNA 940 with transformer-based signal splitting. CA LNA 940 can support CA on multiple sets of carriers in one or more bands. Each set of carriers may include one or more carriers in one band. CA LNA 940 includes N amplifier circuits 950a to 950n for N LNA inputs and transformer 970 providing M output RF signals for M LNA outputs, where M>1 and N>1.

N input matching circuits 932a to 932n receive N receiver input signals, RXin1 to RXinN, and provide N input RF signals, RFin1 to RFinN, to amplifier circuits 950a to 950n, respectively. Matching circuits 932a to 932n may be part of one or more input circuits 332 in FIG. 3. Each matching circuit 932 performs impedance and/or power matching between CA LNA 940 and either an antenna interface circuit or an antenna for one or more bands of interest. The RXin1 to RXinN signals may be for different bands and/or different antennas. For example, the RXin1 to RXinN signals may be the same signal from one antenna, and matching circuits 932a to 932n may perform input matching for different bands. As another example, the RXin1 to RXinN signals may be different signals from different antennas, and matching circuits 932a to 932n may perform input matching for the same band or different bands.

In the exemplary design shown in FIG. 9, each amplifier circuit 950 includes a gain transistor 954, a cascode transistor 956, and a source degeneration inductor 952, which are coupled in similar manner as gain transistor 554, cascode transistor 556, and inductor 552 in FIG. 5. Gain transistors 954 and cascode transistors 956 may be implemented with NMOS transistors, as shown in FIG. 9, or with transistors of other types. Amplifier circuits 950a to 950n may have the same or different transistor sizes, the same or different bias currents, and the same or different bias voltages for gain transistors 954 and cascode transistors 956. Amplifier circuits 950a to 950n may also have the same or different sizes for source degeneration inductors 952.

Gain transistors 954a to 954n receive the RFin1 to RFinN signals from input matching circuits 932a to 932n, respectively. Cascode transistors 956a to 956n receive control signals Vctrl1 to VctrlN, respectively. Each amplifier circuit 950 may be enabled by providing a suitable voltage on the control signal or may be disabled by providing a low voltage on the control signal. Each amplifier circuit 950 amplifies its input RF signal and provides an amplified RF signal when that amplifier circuit is enabled. One amplifier circuit 950 may be enabled at any given moment.

In the exemplary design shown in FIG. 9, transformer 970 includes a primary coil 972 and M secondary coils 974a to 974m. Primary coil 972 has one end coupled to the drain of cascode transistors 956a to 956n and the other end coupled to the VDD power supply. Secondary coils 974a to 974m are magnetically coupled to primary coil 972 and are also coupled to M downconverters 980a to 980m, respectively. Each secondary coil 974 provides a differential output RF signal for a different set of carriers being received to an associated downconverter 980. Each downconverter 980 downconverts its output RF signal with an LO signal at a suitable frequency when that downconverter is selected. The M downconverters 980a to 980m may downconvert their M output RF signals with M LO signals at different frequencies and provide M pairs of I and Q downconverted signals for M sets of carriers.

FIG. 9 shows an exemplary design of CA LNA 940 with N amplifier circuits coupled to a single transformer providing M output RF signals. CA LNA 940 may be referred to as an N×M LNA. The N amplifier circuits may be coupled to N input matching circuits, which may be designed for different bands and/or may be coupled to different antennas. One amplifier circuit may be selected and enabled to drive the transformer.

In another exemplary design, a CA LNA may include N amplifier circuits coupled to K transformers, where N>1 and K>1. Each transformer may provide one or more output RF signals. The N amplifier circuits may be coupled to N input matching circuits. K amplifier circuits may be selected from among the N amplifier circuits to drive the K transformers, which may collectively provide M output RF signals. For example, K sets of amplifier circuits may be coupled to K transformers. Each set of amplifier circuits may be coupled to one transformer and may include any number of amplifier circuits. One amplifier circuit in each set may be selected to drive the associated transformer. Multiple gain transistors in multiple amplifier circuits (e.g., in different sets) may share the same source degeneration inductor in order to reduce the total number of inductors.

Figure 10:
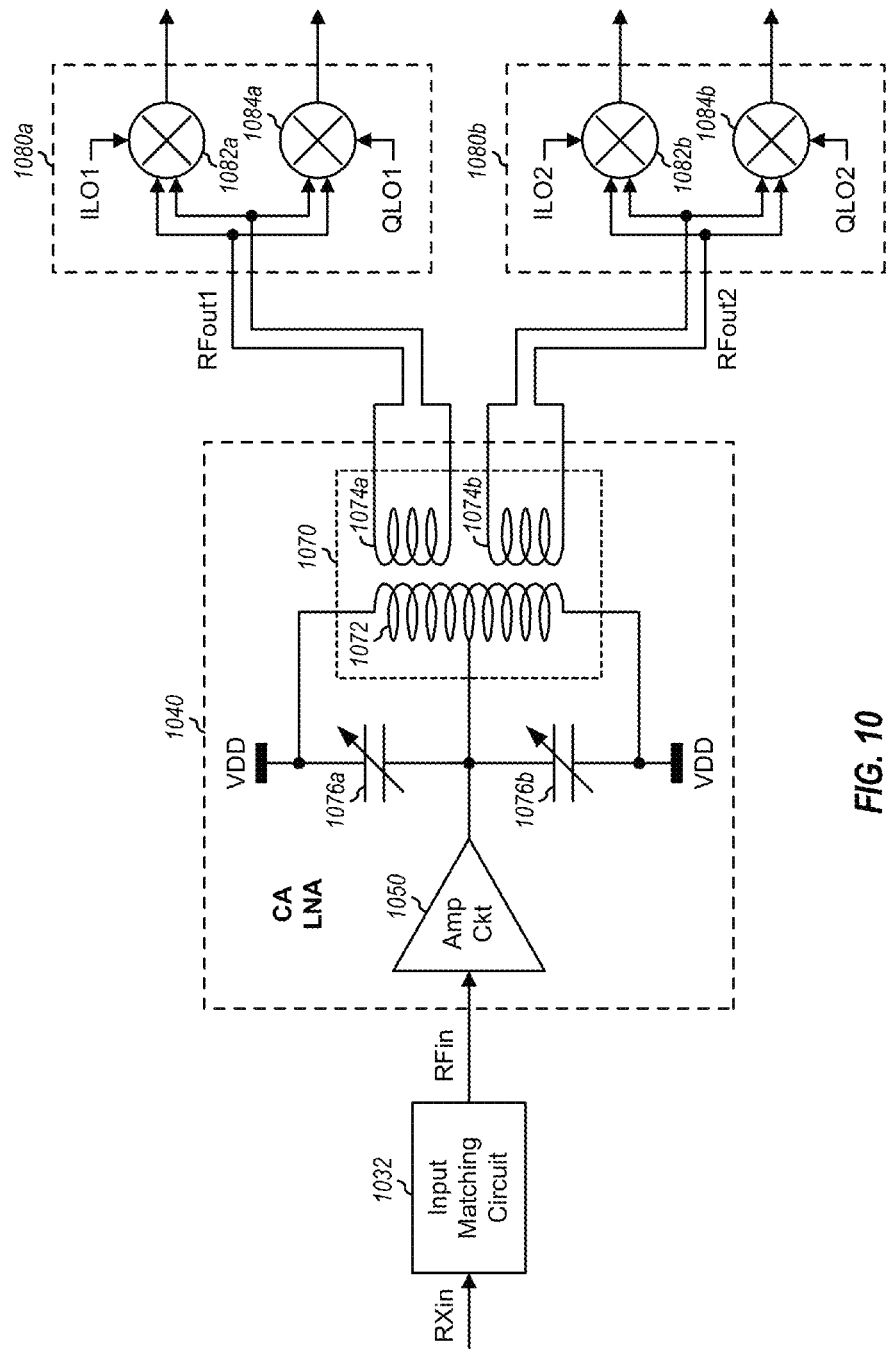

FIG. 10 shows an exemplary design of a CA LNA 1040 with transformer-based signal splitting. CA LNA 1040 includes an amplifier circuit 1050 coupled to a transformer 1070. Amplifier circuit 1050 receives an input RF signal from an input matching circuit 1032 and provides an amplified RF signal. Amplifier circuit 1050 may be implemented with amplifier circuit 450a in FIG. 5, amplifier circuit 450b in FIG. 7, or some other amplifier circuit.

Transformer 1070 includes a primary coil 1072 and two secondary coils 1074a and 1074b. Primary coil 1072 has its center tap receiving the amplified RF signal and its two ends coupled to the VDD power supply. Secondary coils 1074a and 1074b are magnetically coupled to primary coil 1072. Secondary coil 574a provides a first differential output RF signal for a first set of carriers to a downconverter 1080a. Secondary coil 1074b provides a second differential output RF signal for a second set of carriers to a downconverter 1080b. In an exemplary design, secondary coils 1074a and 1074b may be symmetric with respect to each other.

In the exemplary design shown in FIG. 10, a variable capacitor (varactor) 1076a is coupled in parallel with the top half of primary coil 1072, and the combination forms a first resonant circuit. A varactor 1076b is coupled in parallel with the bottom half of primary coil 1072, and the combination forms a second resonant circuit. The first and second resonant circuits may be tuned to a band of interest by varying the values of varactors 1076a and 1076b.

A transformer with a single primary coil and a plurality of secondary coils may be implemented in various manners. The primary and secondary coils may be implemented with various patterns to obtain the desired inductance and coupling. The primary and secondary coils may also be fabricated on one or more conductive layers.

Figure 11:
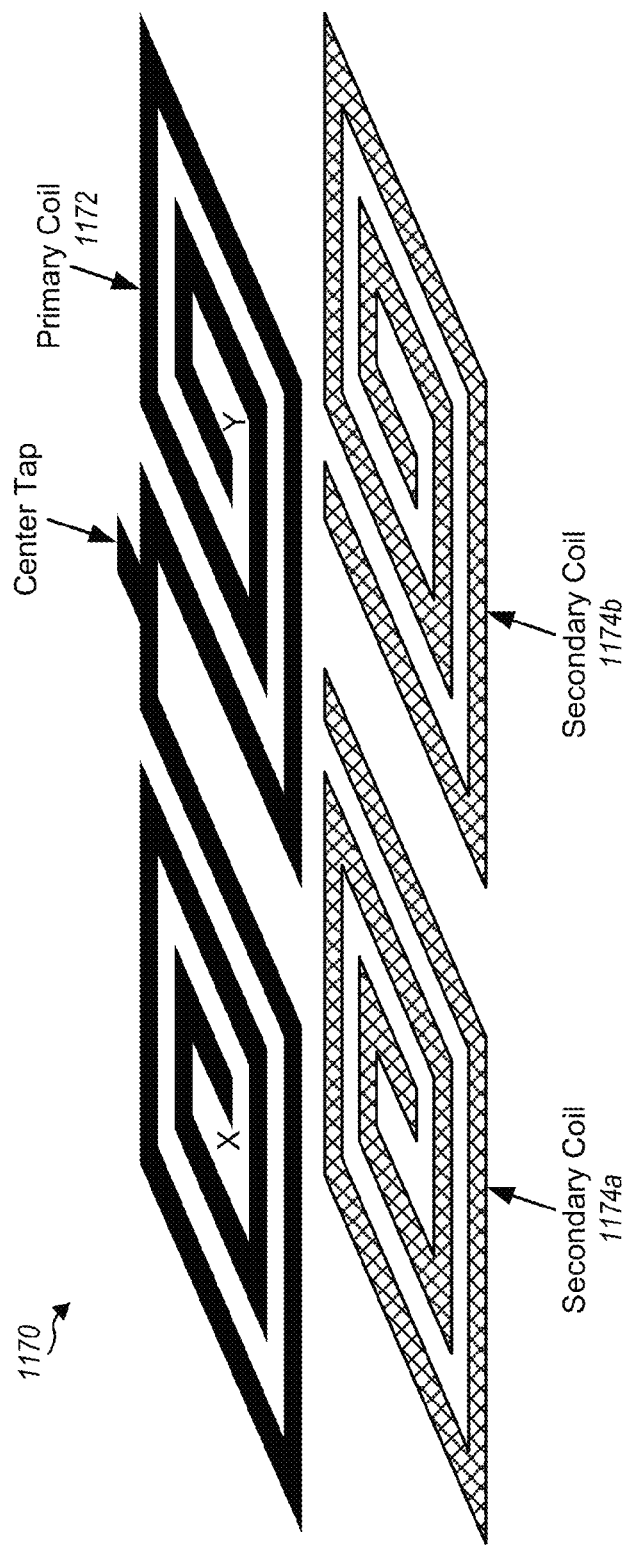
FIG. 11 shows an exemplary design of a transformer with multiple secondary coils to support CA.

FIG. 11 shows a 3-dimensional (3-D) view of an exemplary design of a transformer 1170 comprising a primary coil 1172 and two secondary coils 1174a and 1174b. In the exemplary design shown in FIG. 11, primary coil 1172 is fabricated on a first conductive layer of an RFIC or a circuit module. Primary coil 1172 is symmetric about a center tap and includes a left half located to the left of the center tap and a right half located to the right of the center tap. Primary coil 1172 includes a first end (X) and a second end (Y), which may be coupled as shown in FIG. 5 or 10. Secondary coils 1174a and 1174b are fabricated on a second conductive layer and overlap the left half and the right half, respectively, of primary coil 1172.

FIG. 11 shows an exemplary design in which the primary and secondary coils are implemented with spiral patterns. The left half of primary coil 1172 and secondary coil 1174a may be formed in a first direction (e.g., clockwise in FIG. 11). The right half of primary coil 1172 and secondary coil 1174b may be formed in a second direction (e.g., counter-clockwise in FIG. 11) opposite of the first direction. Forming secondary coils 1174a and 1174b in opposite direction of one another may reduce mutual coupling between the two secondary coils, which may improve isolation between the two output RF signals. In general, different topologies, layout patterns, and fabrication techniques may provide different advantages for a transformer with a single primary coil and multiple secondary coils.

FIG. 11 shows an exemplary design in which primary coil 1172 and secondary coils 1174a and 1174b are stacked and fabricated on two conductive layers. The stacked topology may allow transformer 1170 to be fabricated in a smaller die area and may also result in better matching between the two output RF signals from secondary coils 1174a and 1174b. In another exemplary design, the primary and secondary coils of a transformer may be fabricated side-by-side on a single conductive layer. The side-by-side topology may have less capacitance between the primary and secondary coils as compared to the stacked topology. Less capacitance may be desirable in order to achieve a higher self resonance frequency (SRF) of a transformer for high frequency operation. In yet another exemplary design, the primary and secondary coils of a transformer may be fabricated on three or more conductive layers. For example, the primary coil may be fabricated on a first conductive layer, the first secondary coil may be fabricated on a second conductive layer above the first conductive layer, and the second secondary coil may be fabricated on a third conductive layer below the first conductive layer.

In general, the primary and secondary coils of a transformer may be fabricated with various conductive materials such as a low-loss metal (e.g., copper), a more lossy metal (e.g., aluminum), or some other material. Higher quality factor (Q) may be achieved for a coil fabricated on a low-loss metal layer. A smaller-size coil may be fabricated on a lossy metal layer because different IC design rules may apply.

In an exemplary design, an apparatus (e.g., a wireless device, an IC, a circuit module, etc.) may include an amplifier circuit, a transformer, and a plurality of downconverters, e.g., as shown in FIG. 4 or 5. The amplifier circuit (e.g., amplifier circuit 450a in FIG. 5) may receive and amplify an input RF signal comprising transmissions sent on multiple carriers at different frequencies to a wireless device and may provide an amplified RF signal. The transformer (e.g., transformer 470a in FIG. 5) may comprise a primary coil (e.g., primary coil 572) coupled to the amplifier circuit and a plurality of secondary coils (e.g., secondary coils 574) providing a plurality of output RF signals. The plurality of downconverters (e.g., downconverters 480a and 480b in FIG. 5) may downconvert the plurality of output RF signals with a plurality of LO signals at different frequencies.

In an exemplary design, the primary coil may have a first end receiving the amplified RF signal and a second end coupled to a power supply, e.g., as shown in FIG. 5. In another exemplary design, the primary coil may have a center tap receiving the amplified RF signal and two ends coupled to a power supply, e.g., as shown in FIG. 10. The plurality of secondary coils may be implemented with a plurality of conductors, one conductor for each secondary coil. Each conductor may be electrically isolated from (i.e., not connected to) the remaining conductors. In an exemplary design, the transformer may comprise first and second secondary coils providing first and second output RF signals, respectively. The first and second secondary coils may have a symmetric layout, e.g., as shown in FIG. 11. In an exemplary design, the input RF signal may comprise a single-ended signal, and each output RF signal may comprise a differential signal In an exemplary design, each downconverter may comprise a pair of mixers (e.g., mixers 482 and 484 in FIG. 5) that receives one output RF signals and one LO signal and provides a pair of I and Q downconverted signals for one set of carriers. Each LO signal may be a quadrature signal comprising I and Q LO signals, as shown in FIG. 5. The plurality of downconverters may comprise first and second downconverters. The first downconverter (e.g., downconverter 480a in FIG. 5) may comprise a first pair of mixers that downconverts a first output RF signal with a first LO signal at a first frequency. The second downconverter (e.g., downconverter 480b in FIG. 5) may comprise a second pair of mixers that downconverts a second output RF signal with a second LO signal at a second frequency, which is different from the first frequency.

The amplifier circuit may be implemented in various manners. In one exemplary design, the amplifier circuit comprises a gain transistor, a cascode transistor, and an inductor. The gain transistor (e.g., gain transistor 554 in FIG. 5) may receive the input RF signal. The cascode transistor (e.g., cascode transistor 556) may be coupled to the gain transistor and may provide the amplified RF signal. The inductor (e.g., inductor 552) may be coupled between the source of the gain transistor and circuit ground. In another exemplary design, the amplifier circuit may comprise a gain transistor and a cascode transistor. The gain transistor (e.g., gain transistor 564 in FIG. 7) may have its source coupled to circuit ground and may receive the input RF signal. The cascode transistor (e.g., cascode transistor 566) may be coupled to the gain transistor and may provide the amplified RF signal. The amplifier circuit may also be implemented with other circuit designs.

In an exemplary design, a feedback circuit (e.g., feedback circuit 540 in FIG. 6) may be coupled between the output and input of the amplifier circuit. The feedback circuit may comprise a resistor, a capacitor, a transistor, some other circuit component, or a combination thereof.

In an exemplary design, an input matching circuit may be coupled to the amplifier circuit, e.g., as shown in FIG. 4. In another exemplary design, an attenuation circuit may be coupled to the amplifier circuit, e.g., as shown in FIG. 7. The attenuation circuit may receive the input RF signal and provide an attenuated input RF signal to the amplifier circuit. The attenuation circuit may be adjustable (e.g., as shown in FIG. 7) or may be fixed (not shown in FIG. 7).

The apparatus may further comprise a second amplifier circuit coupled to the transformer circuit. In an exemplary design, the second amplifier circuit may receive the input RF signal or an attenuated input RF signal and may provide a second amplified RF signal, e.g., as shown in FIG. 8. The amplifier circuit (e.g., amplifier circuit 450a in FIG. 8) may have a higher gain than the second amplifier circuit (e.g., amplifier circuit 450b in FIG. 8). In another exemplary design, the second amplifier circuit (e.g., amplifier circuit 950n in FIG. 9) may receive a second input RF signal and provide the second amplified RF signal. For both exemplary designs, the primary coil of the transformer circuit may be driven by the amplifier circuit or the second amplifier circuit.

Figure 12:
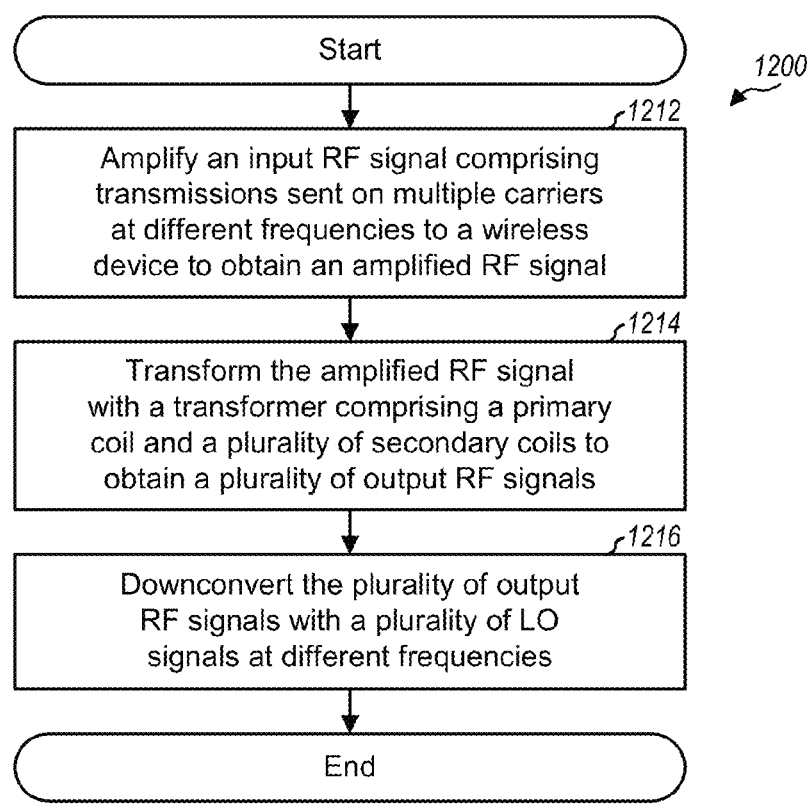
FIG. 12 shows a process for performing signal amplification.

FIG. 12 shows an exemplary design of a process 1200 for performing signal amplification in a wireless system. Process 1200 may be performed by a wireless device or by some other entity. An input RF signal comprising transmissions sent on multiple carriers at different frequencies to a wireless device may be amplified to obtain an amplified RF signal (block 1212). The amplified RF signal may be transformed with a transformer comprising a primary coil and a plurality of secondary coils to obtain a plurality of output RF signals (block 1214). The plurality of output RF signals may be downconverted with a plurality of LO signals at different frequencies (block 1216). Each LO signal may comprise ILO and QLO signals for quadrature downconversion, e.g., as shown in FIG. 5.

In one exemplary design, the plurality of output RF signals may comprise first and second output RF signals, and the plurality of LO signals may comprise first and second LO signals. For block 1216, the first output RF signal may be downconverted with a first pair of mixers using the first LO signal at a first frequency. The second output RF signal may be downconverted with a second pair of mixers using a second LO signal at a second frequency, which may be different from the first frequency.

The LNAs described herein may be implemented on an IC, an analog IC, an RFIC, a mixed-signal IC, an ASIC, a printed circuit board (PCB), an electronic device, etc. The LNAs may also be fabricated with various IC process technologies such as complementary metal oxide semiconductor (CMOS), NMOS, PMOS, bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the LNAs described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
   an amplifier circuit configured to receive and amplify an input radio frequency (RF) signal comprising transmissions sent on multiple carriers at different frequencies to a wireless device and to provide an amplified RF signal;
   a transformer comprising a primary coil coupled to the amplifier circuit and a plurality of secondary coils providing a respective plurality of output RF signals; and
   a plurality of downconverters configured to downconvert the respective plurality of output RF signals with a respective plurality of local oscillator (LO) signals at different frequencies.

2. The apparatus of claim 1, the transformer comprising first and second secondary coils providing first and second output RF signals, respectively.

3. The apparatus of claim 1, the primary coil having a first end receiving the amplified RF signal and a second end coupled to a power supply.

4. The apparatus of claim 1, the primary coil having a center tap receiving the amplified RF signal and two ends coupled to a power supply.

5. The apparatus of claim 1, the plurality of secondary coils being implemented with a plurality of conductors, one conductor for each secondary coil, each conductor being electrically isolated from remaining conductors among the plurality of conductors.

6. The apparatus of claim 1, each of the plurality of downconverters comprising a pair of mixers configured to receive one of the plurality of output RF signals and one of the plurality of LO signals and to provide a pair of inphase (I) and quadrature (Q) downconverted signals for one set of carriers.

7. The apparatus of claim 1, the plurality of downconverters comprising:
   a first downconverter comprising a first pair of mixers configured to downconvert a first output RF signal with a first LO signal at a first frequency; and
   a second downconverter comprising a second pair of mixers configured to downconvert a second output RF signal with a second LO signal at a second frequency different from the first frequency.

8. The apparatus of claim 1, the amplifier circuit comprising:
   a gain transistor configured to receive the input RF signal;
   a cascode transistor coupled to the gain transistor and configured to provide the amplified RF signal; and
   an inductor coupled between a source of the gain transistor and circuit ground.

9. The apparatus of claim 1, the amplifier circuit comprising:
   a gain transistor having a source coupled to circuit ground and configured to receive the input RF signal; and
   a cascode transistor coupled to the gain transistor and configured to provide the amplified RF signal.

10. The apparatus of claim 1, further comprising:
    a feedback circuit coupled between an output and an input of the amplifier circuit.

11. The apparatus of claim 10, the feedback circuit comprising at least one of a resistor, a capacitor, or a transistor.

12. The apparatus of claim 1, further comprising:
    an attenuation circuit coupled to the amplifier circuit and configured to receive the input RF signal and provide an attenuated input RF signal to the amplifier circuit.

13. The apparatus of claim 1, the input RF signal comprising a single-ended signal, and each of the plurality of output RF signals comprising a differential signal.

14. The apparatus of claim 1, further comprising:
    a second amplifier circuit coupled to the transformer circuit and configured to receive the input RF signal or an attenuated input RF signal and provide a second amplified RF signal, the amplifier circuit having a higher gain than the second amplifier circuit.

15. The apparatus of claim 1, further comprising:
    a second amplifier circuit coupled to the transformer circuit and configured to receive a second input RF signal and provide a second amplified RF signal.

16. A method comprising:
    amplifying an input radio frequency (RF) signal comprising transmissions sent on multiple carriers at different frequencies to a wireless device to obtain an amplified RF signal;
    transforming the amplified RF signal with a transformer comprising a primary coil and a plurality of secondary coils to obtain a respective plurality of output RF signals; and
    downconverting the respective plurality of output RF signals with a respective plurality of local oscillator (LO) signals at different frequencies.

17. The method of claim 16, the downconverting comprising:
    downconverting a first output RF signal with a first pair of mixers using a first LO signal at a first frequency; and
    downconverting a second output RF signal with a second pair of mixers using a second LO signal at a second frequency different from the first frequency.

18. An apparatus comprising:
    means for amplifying an input radio frequency (RF) signal comprising transmissions sent on multiple carriers at different frequencies to a wireless device to obtain an amplified RF signal;
    means for transforming the amplified RF signal to obtain a respective plurality of output RF signals; and
    means for downconverting the respective plurality of output RF signals with a respective plurality of local oscillator (LO) signals at different frequencies.

19. The apparatus of claim 18, the means for downconverting comprising:
    first means for downconverting a first output RF signal with a first LO signal at a first frequency; and
    second means for downconverting a second output RF signal with a second LO signal at a second frequency different from the first frequency.

* * * * *